(12) United States Patent  (10) Patent No.: US 9,166,552 B2
Hara et al.  (45) Date of Patent: Oct. 20, 2015

(54) FILTER AND DUPLEXER

(75) Inventors: Motoaki Hara, Miyagi (JP); Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 673 days.

(21) Appl. No.: 13/477,732

(22) Filed: May 22, 2012

(65) Prior Publication Data

US 2012/0299664 A1    Nov. 29, 2012

(30) Foreign Application Priority Data

May 24, 2011   (JP) ................................. 2011-116357

(51) Int. Cl.
*H03H 9/02* (2006.01)
*H03H 9/70* (2006.01)
*H03H 9/17* (2006.01)

(52) U.S. Cl.
CPC ......... *H03H 9/0211* (2013.01); *H03H 9/02118* (2013.01); *H03H 9/02157* (2013.01); *H03H 9/706* (2013.01); *H03H 9/171* (2013.01)

(58) Field of Classification Search
CPC ............ H03H 9/0211; H03H 9/02118; H03H 9/02157; H03H 9/171; H03H 9/703; H03H 9/706
USPC .......................... 333/133, 186, 187, 188, 189
See application file for complete search history.

(56) References Cited

U.S. PATENT DOCUMENTS 6,812,619 B1    11/2004   Kaitila et al.
7,280,007 B2 *  10/2007   Feng et al. .................... 333/187
2006/0071736 A1  4/2006   Ruby et al.
2006/0103492 A1  5/2006   Feng et al.
2008/0143215 A1  6/2008   Hara et al.
2008/0150653 A1  6/2008   Hara et al.
2010/0019864 A1* 1/2010   Yokoyama et al. ........... 333/187

FOREIGN PATENT DOCUMENTS

CN    101170303 A    4/2008
CN    101207370 A    6/2008
GB      2418791 A    4/2006

(Continued)

OTHER PUBLICATIONS

Chinese Office Action dated Aug. 4, 2014, in a counterpart Chinese patent application No. 201210165066.7.

(Continued)

*Primary Examiner* — Robert Pascal
*Assistant Examiner* — Jorge Salazar, Jr.
(74) *Attorney, Agent, or Firm* — Chen Yoshimura LLP

(57) ABSTRACT

A filter includes one or a plurality of parallel resonators coupled in parallel and one or a plurality of a film bulk acoustic resonators coupled in series, the film bulk acoustic resonator having a substrate, a lower electrode, a piezoelectric membrane, and an upper electrode, wherein: at least one of the lower electrode and the upper electrode has a thick membrane region having a thickness larger than that of a center portion of a resonance region at an edge of the resonance region, the resonance region being a region where the lower electrode and the upper electrode face with each other through the piezoelectric membrane; and a width of the thick membrane region is smaller than a wavelength of an acoustic wave propagating in a direction crossing a thickness direction of the piezoelectric membrane.

14 Claims, 26 Drawing Sheets

(56) References Cited

FOREIGN PATENT DOCUMENTS

| GB | 2427773 A | 1/2007 |
|---|---|---|
| JP | 2006-109472 A | 4/2006 |
| JP | 2007-6501 A | 1/2007 |
| JP | 2007-96899 A | 4/2007 |

OTHER PUBLICATIONS

Thalhammer et al., "Spurious mode suppression in BAW resonators," IEEE Ultrasonics Symposium, 2006, pp. 456-459.

* cited by examiner

FIG. 11A
FIG. 11B
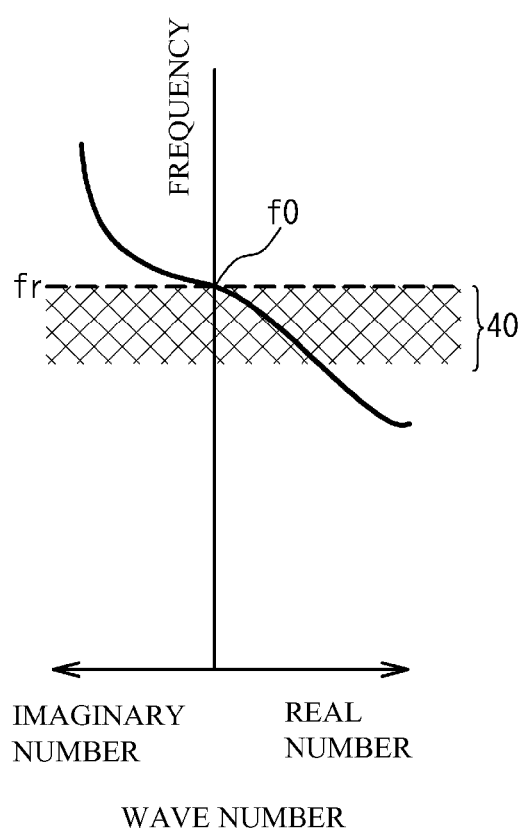
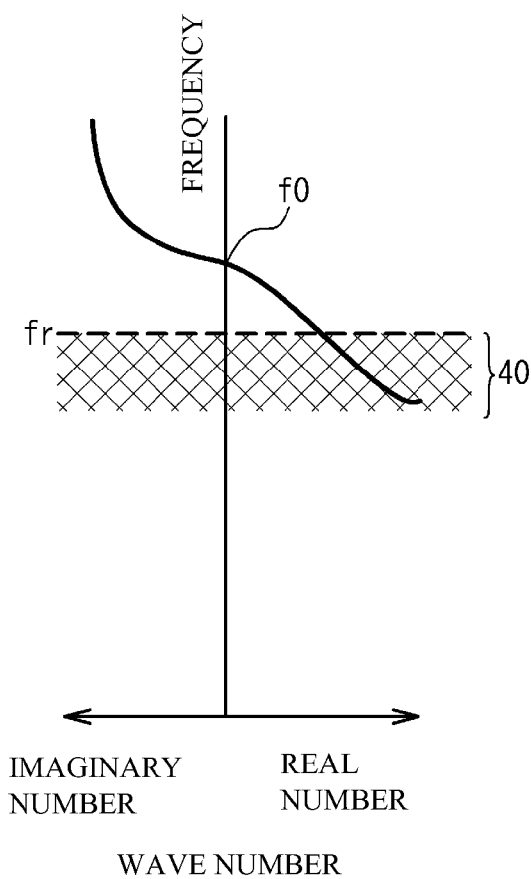

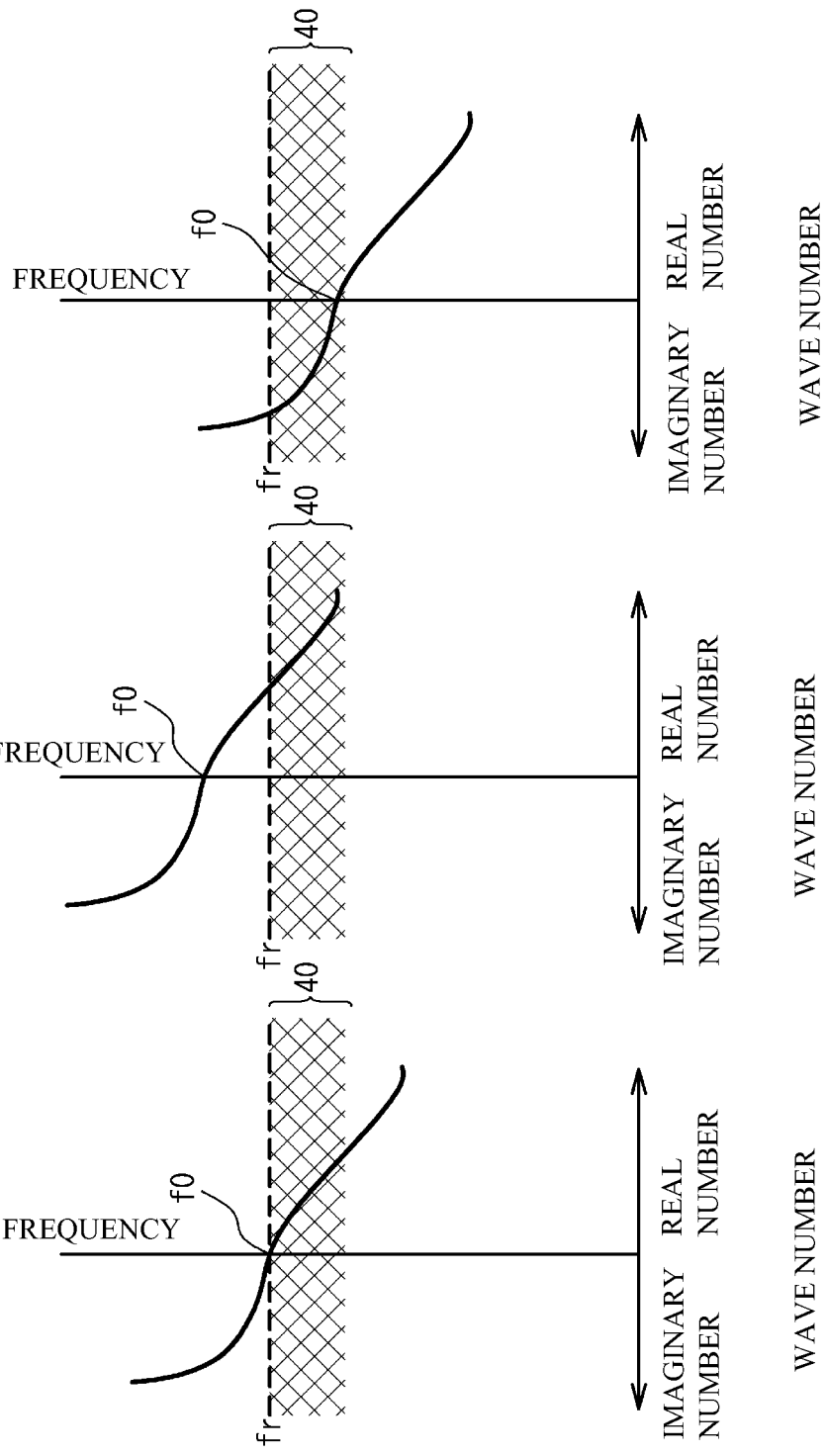

FIG. 15A
FIG. 15B
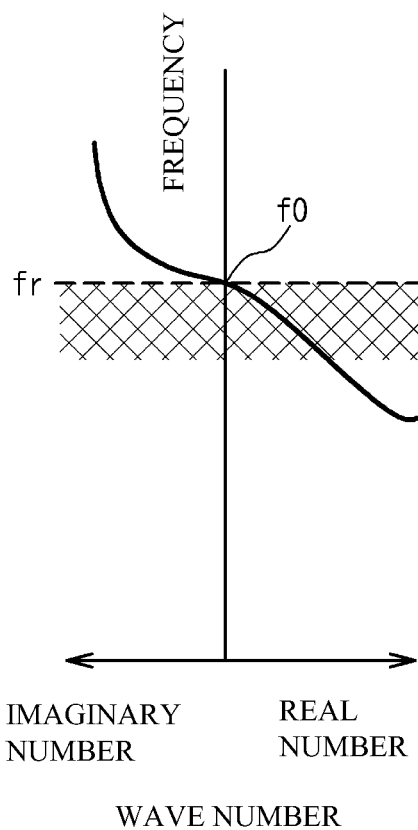
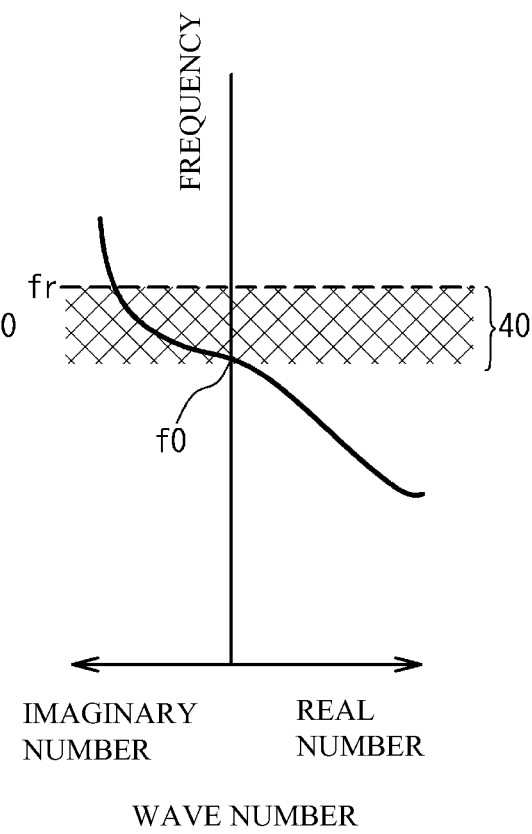

FILTER AND DUPLEXER

CROSS-REFERENCE TO RELATED APPLICATION

This application is based upon and claims the benefit of priority of the prior Japanese Patent Application No. 2011-116357, filed on May 24, 2011, the entire contents of which are incorporated herein by reference.

FIELD

A certain aspect of the present invention relates to a filter and a duplexer, an in particular, relates to a filter and a duplexer having a thick membrane region at an edge of a resonance region.

BACKGROUND

A demand for a high frequency filter is rapidly enhanced because a wireless communication device such as a mobile phone is rapidly spread. In particular, an acoustic wave filter having a small size and having high precipitousness is demanded. The acoustic wave filter has an acoustic wave resonator. For example, in a high frequency band higher than 2 GHz band, a film bulk acoustic resonator is focused as a resonator having a small size and small loss. The film bulk acoustic resonator has a lower electrode, an upper electrode and a piezoelectric membrane between the lower electrode and the upper electrode. A region where the lower electrode and the upper electrode face with each other through the piezoelectric membrane is a resonance region contributing to a resonance. An acoustic wave propagating in a thickness direction of a resonance membrane contributes to resonance characteristics mainly. A spurious may occur when the acoustic wave propagating in the thickness direction propagates in a lateral direction.

Japanese Patent Application Publication No. 2006-109472 (hereinafter referred to as Document 1) discloses an art where the propagation of the acoustic wave in the lateral direction is restrained and the spurious is restrained by providing a thin membrane region that is a part of the upper electrode and is thinner than a center portion of the resonance region at an edge of the resonance region. Japanese Patent Application Publication No. 2007-6501 (hereinafter referred to as Document 2) and Proceeding of IEEE international ultrasonic symposium 2006, pp 456-459 (hereinafter referred to as Document 3) disclose an art where the propagation of the acoustic wave in the lateral direction is restrained more and the spurious is restrained more by providing a thick membrane region that is a part of the upper electrode and is thicker than a center portion of the resonance region outside of a thin membrane region.

However, with the method of Document 1, loss may be enlarged. With the methods of Document 2 and Document 3, a manufacturing cost may be enlarged when the upper electrode has three different thicknesses.

SUMMARY OF THE INVENTION

According to an aspect of the present invention, there is provided a filter including: one or a plurality of parallel resonators coupled between an inputting terminal and an outputting terminal in parallel; and one or a plurality of film bulk acoustic resonators that acts as a series resonator and is coupled between the inputting terminal and the outputting terminal in series, the film bulk acoustic resonator having a substrate, a lower electrode provided on the substrate, a piezoelectric membrane provided on the lower electrode, and an upper electrode provided on the piezoelectric membrane, wherein: at least one of the lower electrode and the upper electrode has a thick membrane region having a thickness larger than that of a center portion of a resonance region at an edge of the resonance region, the resonance region being a region where the lower electrode and the upper electrode face with each other through the piezoelectric membrane; and a width of the thick membrane region is smaller than a wavelength of an acoustic wave propagating in a direction crossing a thickness direction of the piezoelectric membrane.

According to another aspect of the present invention, there is provided another a filter including: one or a plurality of parallel resonators coupled between an inputting terminal and an outputting terminal in parallel; and one or a plurality of film bulk acoustic resonators that acts as a series resonator and is coupled between the inputting terminal and the outputting terminal in series, the film bulk acoustic resonator having a substrate, a lower electrode provided on the substrate, a piezoelectric membrane provided on the lower electrode, and an upper electrode provided on the piezoelectric membrane, wherein: at least one of the lower electrode and the upper electrode has a thick membrane region having a thickness larger than that of a center portion of a resonance region at an edge of the resonance region, the resonance region being a region where the lower electrode and the upper electrode face with each other through the piezoelectric membrane; and a width "w" of the thick membrane region is expressed as the following formula when a resonance frequency of the film bulk acoustic resonator is "fr", stiffness of the piezoelectric membrane is "c11", and a density of the piezoelectric membrane is "$\rho$".

$$w < \frac{1}{f_r}\sqrt{\frac{c11}{\rho}}$$

According to another aspect of the present invention, there is provided a duplexer including: a first filter coupled between a common terminal and a first terminal; and a second filter that is coupled between the common terminal and a second terminal and has a pass band higher than that of the first filter, the first filter having one or a plurality of parallel resonators coupled between an inputting terminal and an outputting terminal in parallel, and one or a plurality of film bulk acoustic resonators that acts as a series resonator and is coupled between the inputting terminal and the outputting terminal in series, the film bulk acoustic resonator having a substrate, a lower electrode provided on the substrate, a piezoelectric membrane provided on the lower electrode, and an upper electrode provided on the piezoelectric membrane, wherein: at least one of the lower electrode and the upper electrode has a thick membrane region having a thickness larger than that of a center portion of a resonance region at an edge of the resonance region, the resonance region being a region where the lower electrode and the upper electrode face with each other through the piezoelectric membrane; and a width of the thick membrane region is smaller than a wavelength of an acoustic wave propagating in a direction crossing a thickness direction of the piezoelectric membrane.

BRIEF DESCRIPTION OF THE DRAWINGS

FIG. 11A and FIG. 11B illustrate a dispersion curve in a center portion of a resonance region and a thin membrane region of the second comparative example;

FIG. 13A through FIG. 13C illustrate dispersion curves of a center portion of a resonance region, a thin membrane region and a thick membrane region of the third comparative example;

FIG. 15A and FIG. 15B illustrate dispersion curves of a center portion of a resonance region and a thick membrane region of the fourth comparative example;

DETAILED DESCRIPTION

Figure 1A:
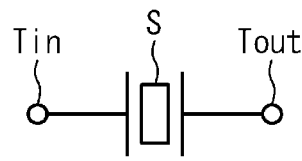
FIG. 1A illustrates a configuration diagram of a series resonator.
Figure 1B:
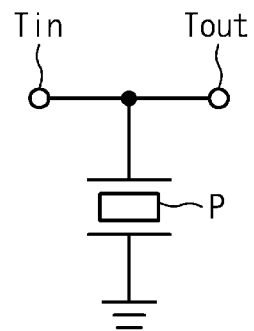
FIG. 1B illustrates a configuration diagram of a parallel resonator.
Figure 1C:
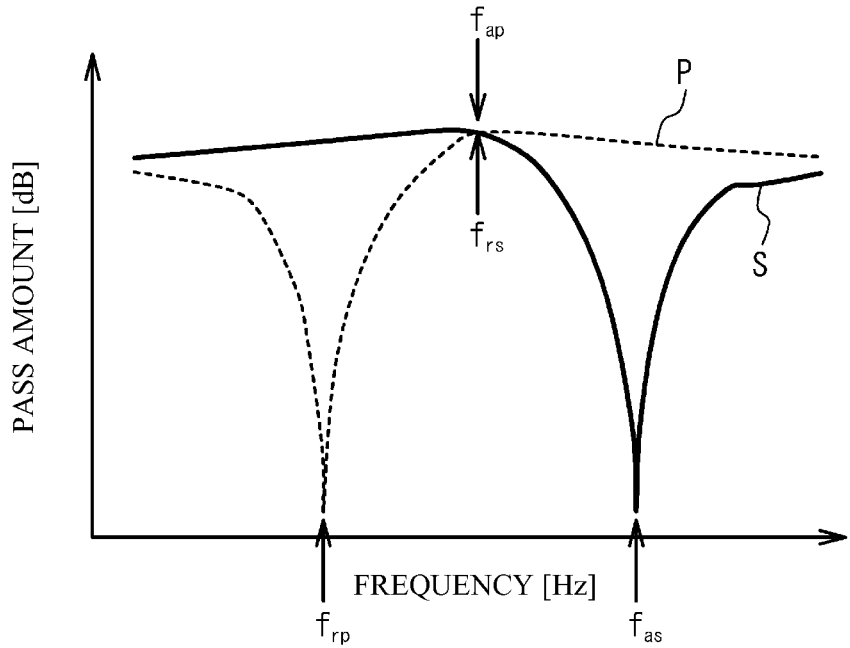
FIG. 1C illustrates pass characteristics of the series resonator and the parallel resonator.

First, a description is given of a spurious with reference to a ladder type filter. FIG. 1A illustrates a configuration diagram of a series resonator. FIG. 1B illustrates a configuration diagram of a parallel resonator. FIG. 1C illustrates pass characteristics of the series resonator and the parallel resonator.

As illustrated in FIG. 1A, a series resonator S has a pair of signal terminals. One of the signal terminals is an inputting terminal Tin. The other is an outputting terminal Tout. As illustrated in FIG. 1B, a parallel resonator P has a pair of signal terminals. One of the signal terminals is coupled to a ground terminal. The other is coupled to a line coupling the inputting terminal Tin and the outputting terminal Tout.

A horizontal axis of FIG. 1C indicates a frequency. A vertical axis of FIG. 1C indicates a pass amount. A solid line S indicates pass characteristics of the series resonator S. A dotted line P indicates pass characteristics of the parallel resonator P. As illustrated in FIG. 1C, the pass characteristics of the series resonator S have a resonance point $f_{rs}$ (resonance frequency) and an anti-resonance point $f_{as}$ (anti-resonance frequency). The pass amount is maximum at the resonance point $f_{rs}$. The pass amount is minimum at the anti-resonance point $f_{as}$. On the other hand, the pass characteristics of the parallel resonator P have a resonance point $f_{rp}$ and an anti-resonance point $f_{ap}$. The pass amount is minimum at the resonance point $f_{rp}$. The pass amount is maximum at the anti-resonance point $f_{ap}$.

Figure 2A:
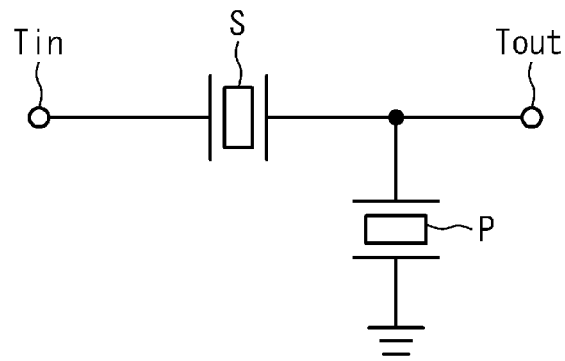
FIG. 2A illustrates a configuration diagram of a single ladder filter.
Figure 2B:
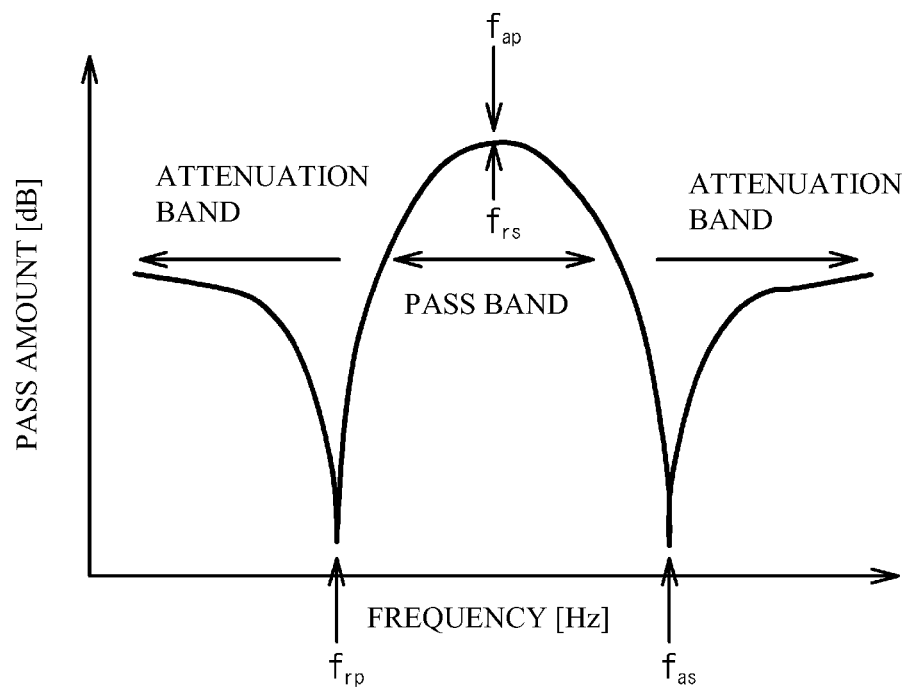
FIG. 2B illustrates pass characteristics of the single ladder filter.

FIG. 2A illustrates a configuration diagram of a single ladder filter. FIG. 2B illustrates pass characteristics of the single ladder filter. As illustrated in FIG. 2A, the series resonator S is coupled to the inputting terminal Tin and the outputting terminal Tout in series. The parallel resonator P is coupled between the outputting terminal Tout and a ground. For example, the single ladder filter is designed so that the resonance point $f_{rs}$ of the series resonator S approximately corresponds to the anti-resonance point $f_{ap}$ of the parallel resonator P.

A horizontal axis of FIG. 2B indicates a frequency. A vertical axis of FIG. 2B indicates a pass amount. With the structure of FIG. 2A, the pass characteristics of the series resonator S and the pass characteristics of the parallel resonator P are combined into pass characteristics of FIG. 2B. The pass amount is maximum around the resonance point $f_{rs}$ of the series resonator S and the resonance point $f_{ap}$ of the parallel resonator P. On the other hand, the pass amount is minimum around the anti-resonance point $f_{as}$ of the series resonator S and the anti-resonance point $f_{rp}$ of the parallel resonator P. A frequency band between the resonance point $f_{rp}$ of the parallel resonator P and the anti-resonance point $f_{as}$ of the series resonator S is a pass band. A frequency band less than the resonance point $f_{rp}$ of the parallel resonator P and another frequency band more than the anti-resonance point $f_{as}$ of the series resonator S are an attenuation band. Thus, the ladder type filter acts as a band pass filter.

Figure 3A:
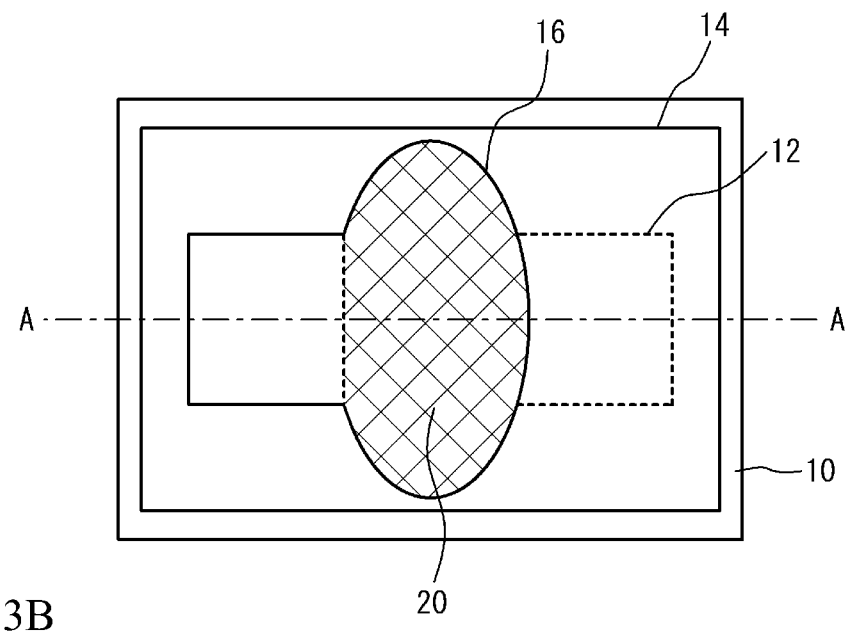
FIG. 3A illustrates a top view of a film bulk acoustic resonator.
Figure 3B:
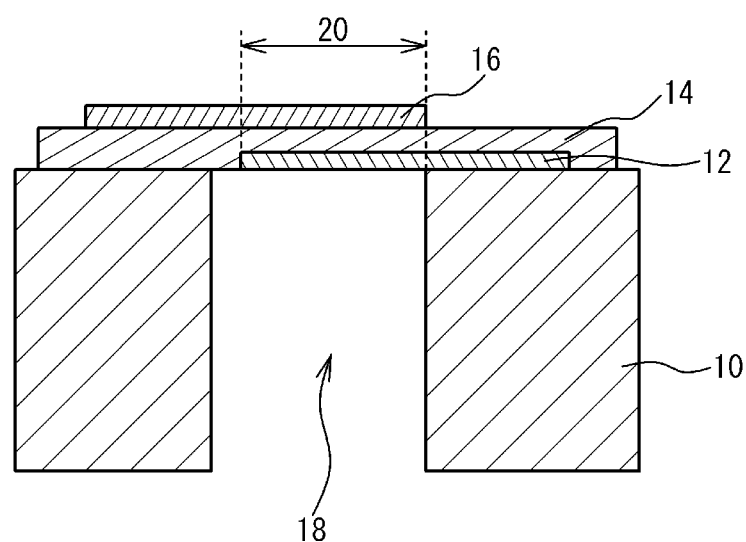
FIG. 3B illustrates a cross sectional view taken along a line A-A of FIG. 3A.

Next, a description is given of a film bulk acoustic resonator as a resonator. FIG. 3A illustrates a top view of the film bulk acoustic resonator. FIG. 3B illustrates a cross sectional view taken along a line A-A of FIG. 3A. As illustrated in FIG. 3A and FIG. 3B, a lower electrode 12 is provided on a substrate 10. A piezoelectric membrane 14 is provided on the lower electrode 12. An upper electrode 16 is provided on the piezoelectric membrane 14. A resonance region 20 is a region where the lower electrode 12 faces with the upper electrode 16 through the piezoelectric membrane 14. The substrate 10 has a void 18 under the resonance region 20.

Figure 4A:
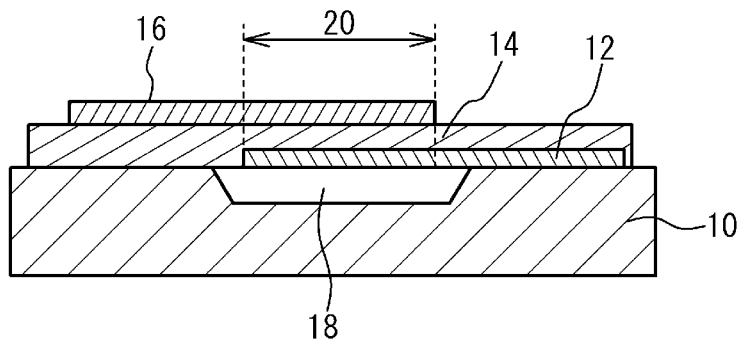
FIG. 4A to FIG. 4C illustrate a cross sectional view of another film bulk acoustic resonator.
Figure 4B:
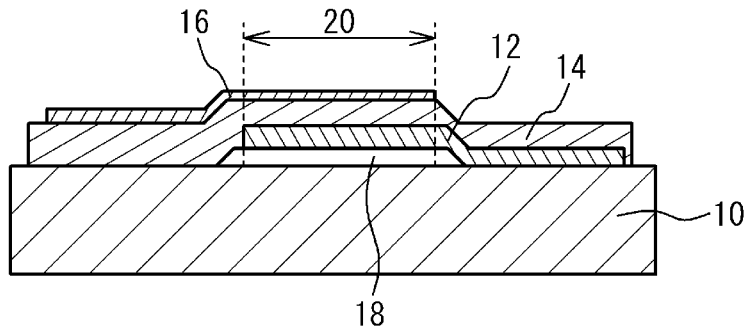
Figure 4C:
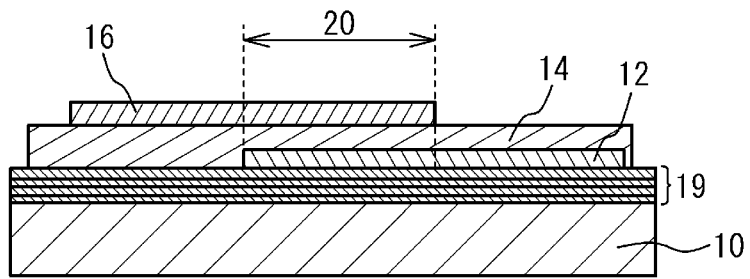

FIG. 4A to FIG. 4C illustrate a cross sectional view of another film bulk acoustic resonator. In FIG. 4A, a recess is formed in an upper face of the substrate 10. The void 18 is formed between the substrate 10 and the lower electrode 12. In FIG. 4B, an upper face of the substrate 10 is flat. The lower electrode 12 is formed so that the void 18 is formed between the lower electrode 12 and the substrate 10. In FIG. 4C, a sound reflecting membrane 19 reflecting an acoustic wave is provided between the substrate 10 and the lower electrode 12 instead of the void 18. A membrane in which a membrane having high acoustic impedance and having a thickness of a wavelength of an acoustic wave and a membrane having low acoustic impedance and having a thickness of the wavelength are laminated alternately may be used as the sound reflecting membrane 19.

As illustrated in FIG. 3A through FIG. 4C, the film bulk acoustic resonator is a weak device made of a thin membrane and is provided on the substrate 10 so as not to be damaged by handling. However, it is preferable that the substrate 10 is acoustically insulated from the resonance region 20 in order to establish preferable resonance characteristics. It is therefore preferable that the void 18 or the sound reflecting membrane 19 includes the resonance region 20. The void 18 or the sound reflecting membrane 19 may be provided in a region partially including the resonance region 20.

The film bulk acoustic resonator achieves resonance characteristics with use of a bulk wave of a thickness longitudinal vibration excited in the piezoelectric membrane 14, when a high frequency wave signal is applied between the lower electrode 12 and the upper electrode 16. The film bulk acoustic resonator uses propagation of vibration energy of the bulk wave of the thickness longitudinal vibration in a thickness direction of the piezoelectric membrane 14. However, there exists propagation of the vibration energy in a direction (for example, a direction perpendicular to the thickness direction such as a planar direction of the piezoelectric membrane 14) crossing the thickness direction of the piezoelectric membrane 14. The vibration energy propagating in the direction crossing the thickness direction of the piezoelectric membrane 14 is overlapped with a main vibration of propagation of the vibration energy in the thickness direction and is observed as a spurious.

Figure 5A:
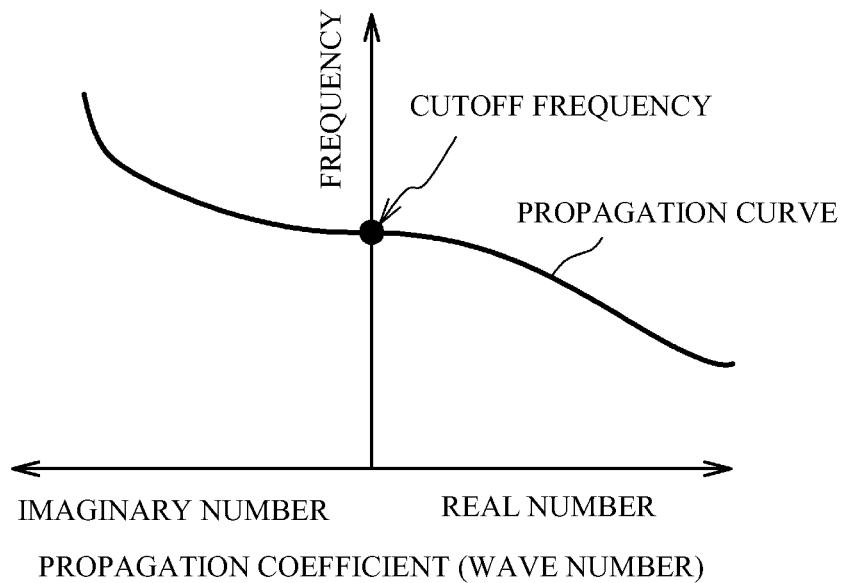
FIG. 5A illustrates a schematic view of a dispersion curve of a thickness longitudinal vibration.

FIG. 5A illustrates a schematic view of a dispersion curve of the thickness longitudinal vibration. In FIG. 5A, a horizontal axis indicates a propagation coefficient (wave number) in the planar direction of the piezoelectric membrane 14. A vertical axis indicates a frequency. A right side relative to the vertical axis indicates a real number of the propagation coefficient. There exits the energy propagation in the planar direction of the piezoelectric membrane 14 in the frequency range on the right side. A left side relative to the vertical axis indicates an imaginary number of the propagation coefficient. There does not exist the energy propagation in the planar direction of the piezoelectric membrane 14 in the frequency range on the left side. That is, an acoustic wave does not propagate in the planar direction of the piezoelectric membrane 14. A point where the dispersion curve crosses the frequency axis is a cutoff frequency. In FIG. 5A, the acoustic wave does not propagate in the planar direction of the piezoelectric membrane 14 at a frequency higher than the cutoff frequency. On the other hand, the acoustic wave propagates in the planar direction of the piezoelectric membrane 14 at a frequency lower than the cutoff frequency. Generally, a cutoff frequency approximately corresponds to a resonance frequency of a resonator. As illustrated in FIG. 5A, with respect to a substance having a Poisson ratio of 0.3 or less, the dispersion curve indicates a real number at a frequency lower than the cutoff frequency. For example, aluminum nitride (AlN) arrayed in (002) direction is an example of the substance having the Poisson ratio of 0.3 or less.

Figure 5B:
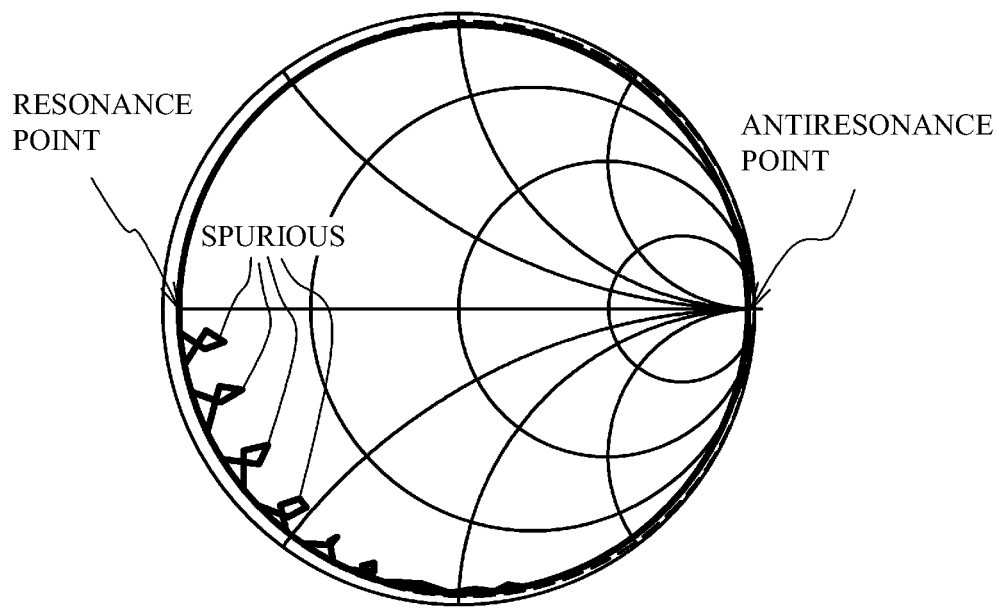
FIG. 5B illustrates a schematic view of a Smith chart of pass characteristics of a resonator establishing a dispersion curve of FIG. 5A.

FIG. 5B illustrates a schematic view of a Smith chart of pass characteristics of a resonator establishing the dispersion curve of FIG. 5A. As illustrated in FIG. 5B, a spurious is generated at a frequency lower than the resonance point. Thus, with respect to the resonator establishing the dispersion curve of FIG. 5A, the propagation coefficient in the planar direction of the piezoelectric membrane 14 indicates a real number at a frequency lower than the resonance frequency. Therefore, an acoustic wave propagates in the planar direction of the piezoelectric membrane 14, and the spurious is generated. On the other hand, the propagation coefficient in the planar direction of the piezoelectric membrane 14 indicates an imaginary number at a frequency higher than the resonance frequency. Therefore, an acoustic wave does not propagate in the planar direction of the piezoelectric membrane 14, and a spurious is not generated.

Figure 6:
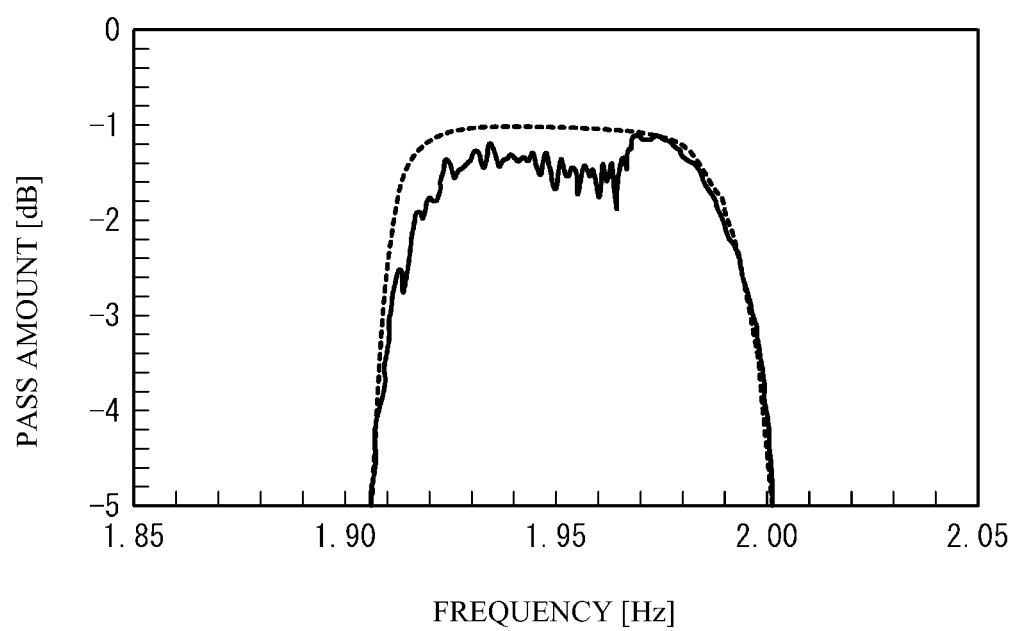
FIG. 6 illustrates a schematic view of pass characteristics of a ladder type filter.

FIG. 6 illustrates a schematic view of pass characteristics of a ladder type filter. The ladder type filter includes a resonator establishing the pass characteristics of FIG. 5B. A dotted line of FIG. 6 indicates pass characteristics of the ladder type filter without consideration of influence of the spurious of FIG. 5B. A solid line of FIG. 6 indicates pass characteristics of the ladder type filter with consideration of the influence of the spurious of FIG. 5B. As illustrated in FIG. 6, a plurality of ripples are generated in the pass band if the spurious is considered. The ripples are generated because each spurious of resonators is overlapped. A spurious of a resonator degrades an insertion loss of a filter and generates a ripple in the pass band. Therefore, restraint of a spurious of a resonator is demanded.

Figure 7:
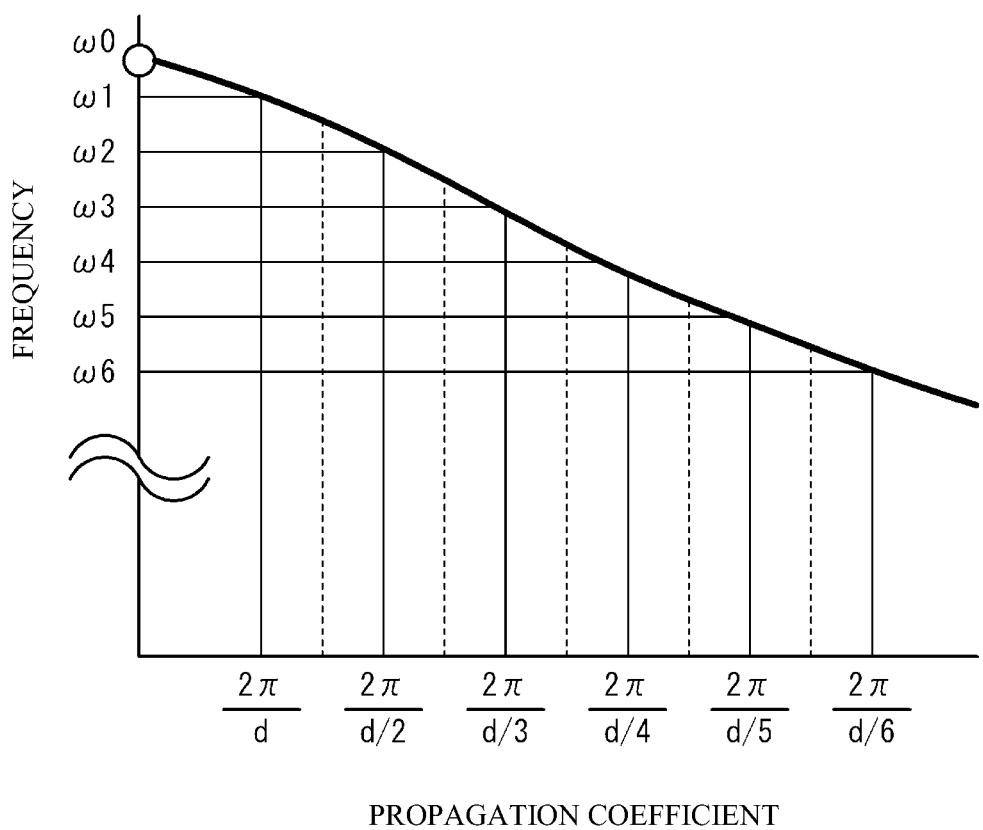
FIG. 7 illustrates a schematic view of a frequency with respect to a propagation coefficient.
Figure 8A:
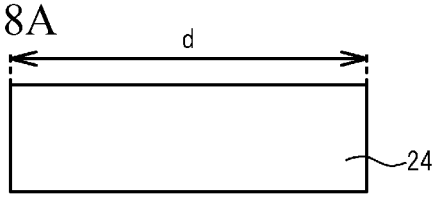
FIG. 8A through FIG. 8I illustrate a schematic view of each standing wave.
Figure 8B:
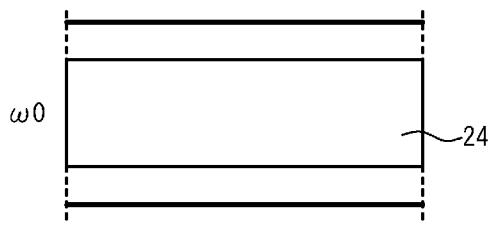
Figure 8F:
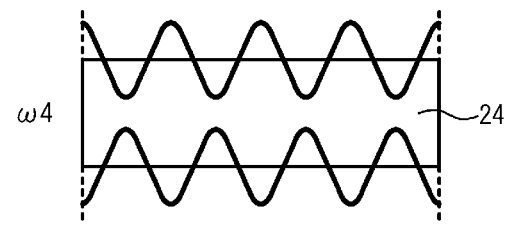
Figure 8C:
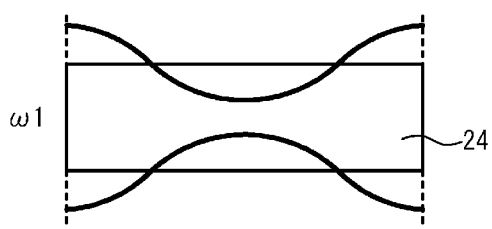
Figure 8G:
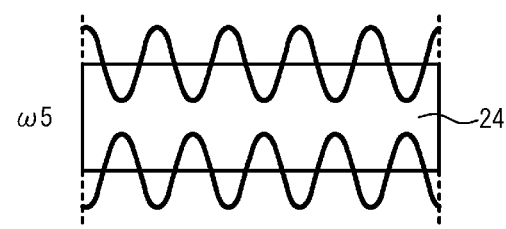
Figure 8D:
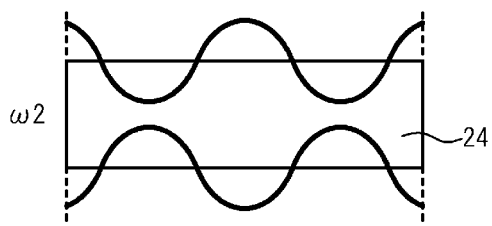
Figure 8H:
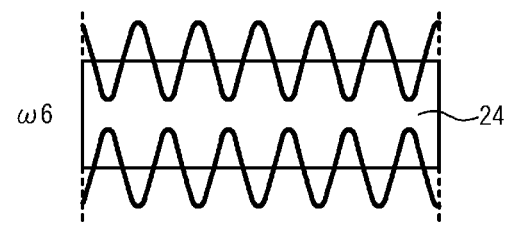
Figure 8E:
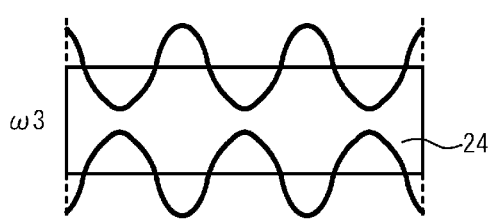
Figure 8I:
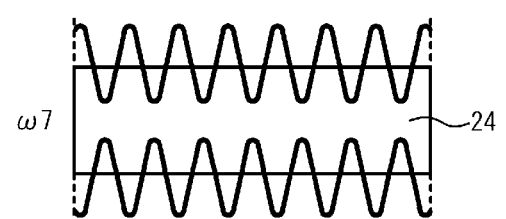

A description is given of a piston mode in order to describe the restraint of a spurious. FIG. 7 illustrates a schematic view of a frequency with respect to the propagation coefficient. FIG. 8A through FIG. 8I illustrate a schematic view of each standing wave. As illustrated in FIG. 8A, a description is given of a piezoelectric board 24 that is an excited region having a length "d", of which edges are not supported. In the piezoelectric board 24, standing waves from zero order to high order are generated. Frequencies of a zero order standing wave to a seventh order standing wave are referred to as "ω0" to "ω7". Thick solid lines of FIG. 8B to FIG. 8I indicate the zero order to seventh order standing waves. In FIG. 7, the zero order standing wave corresponds to an acoustic wave of which propagation coefficient is zero. That is, "ω0" is approximately equal to the resonance frequency. The first order standing wave to the sixth order standing wave correspond to acoustic waves of which propagation coefficient is $2\pi/(d/1)$ to $2\pi/(d/6)$.

As illustrated in FIGS. 8B to FIG. 8I, in the piston mode, the edges of the piezoelectric board 24 are not supported. Therefore, a displacement of an acoustic wave indicates maximum at the edges. The displacement mode is called the piston mode. In the piston mode, when the displacement amount is integrated in the length direction of the piezoelectric board 24, the standing waves other than the zero order standing wave are zero. This is because total amount of electric charge on a surface of the piezoelectric board 24 is zero, with respect to the standing waves other than the zero order standing wave. Therefore, a response other than a resonance response is not electrically output, and a spurious is not generated. With respect to the zero order standing wave, the propagation coefficient is zero. And, there is no propagation in the planar direction of the piezoelectric board 24. Therefore, a spurious is not generated.

As mentioned above, a spurious is not generated in the piston mode. However, in an actual resonator, the resonance region 20 is supported by the substrate 10. Therefore, edges of a piezoelectric board are not perfectly free.

Figure 9A:
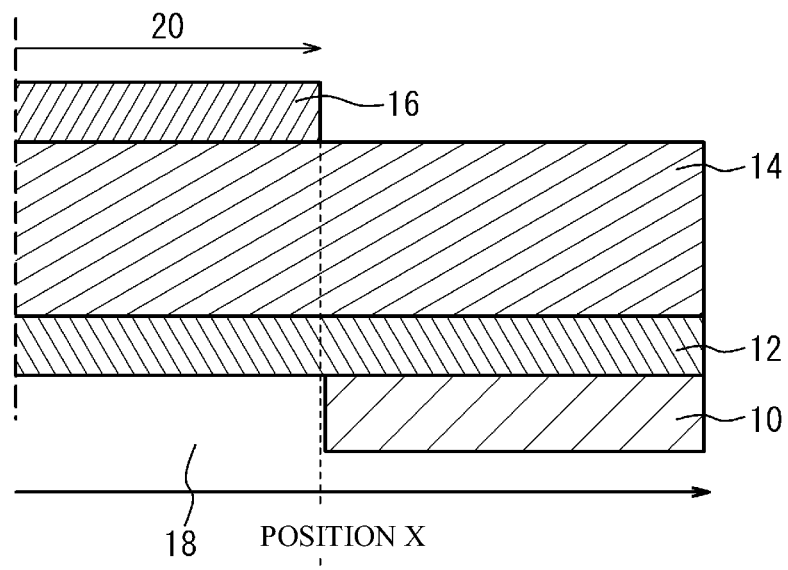
FIG. 9A illustrates a schematic cross sectional view around an edge of a resonance region of a resonator in accordance with a first comparative example.
Figure 9B:
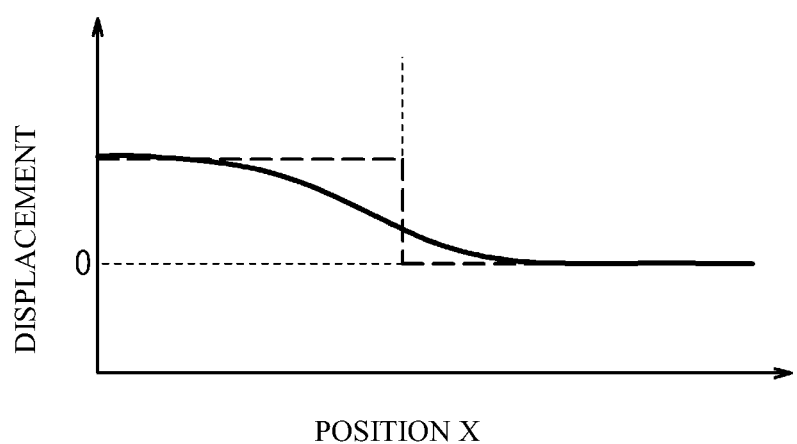
FIG. 9B illustrates a schematic view of a displacement of a piezoelectric membrane.

A description is given of a model in which a spurious is generated, with reference to a first comparative example. FIG. 9A illustrates a schematic cross sectional view around an edge of a resonance region of a resonator in accordance with the first comparative example. FIG. 9B illustrates a schematic view of a displacement of a piezoelectric membrane. FIG. 9A illustrates a schematic view of the substrate 10, the lower electrode 12, the piezoelectric membrane 14, the upper electrode 16 and the void 18 around the edge of the resonance region 20 in accordance with the first comparative example. FIG. 9B illustrates a displacement of the piezoelectric membrane 14 with respect to position X in the planar direction of the piezoelectric membrane 14 of FIG. 9A. A broken line indicates an ideal case. Ideally, the displacement of the piezoelectric membrane 14 is changed to zero abruptly at the edge of the resonance region 20. However, an actual displacement of the piezoelectric membrane 14 fluctuates smoothly with respect the position X as indicated by a solid line. This is because the piezoelectric membrane 14 of the region supported by the substrate 10 makes a simple damped vibration because the edge of the piezoelectric membrane 14 is not perfectly free. In the resonance region 20, the piston mode is distorted, because the resonance region 20 is subjected to interference of the vibration. In this case, a total amount of electric charge in the planar direction of the resonance region 20 has a finite value in the standing waves other than the zero order standing wave. Therefore, a spurious response is electrically output.

Figure 10A:
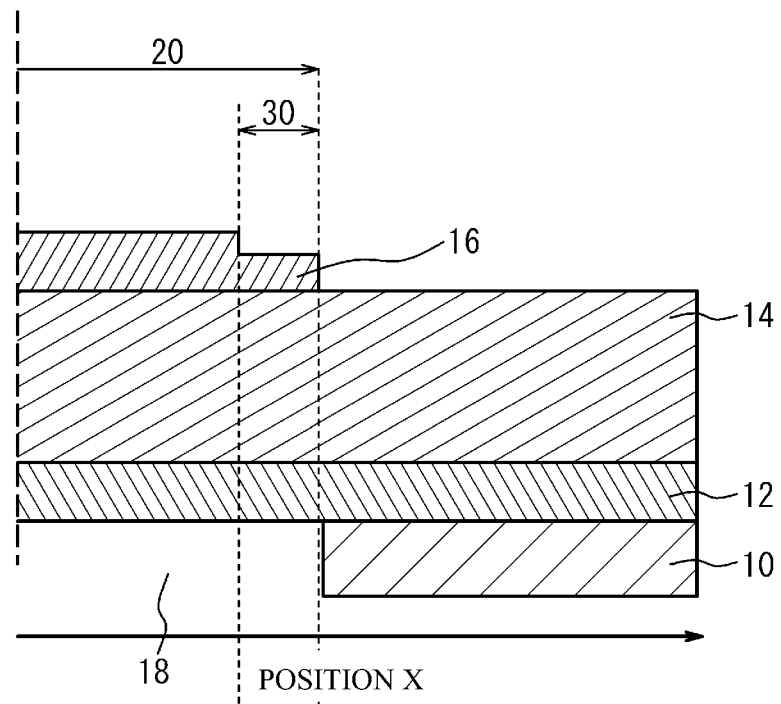
FIG. 10A illustrates a schematic cross sectional view around an edge of a resonance region of a resonator in accordance with a second comparative example.
Figure 10B:
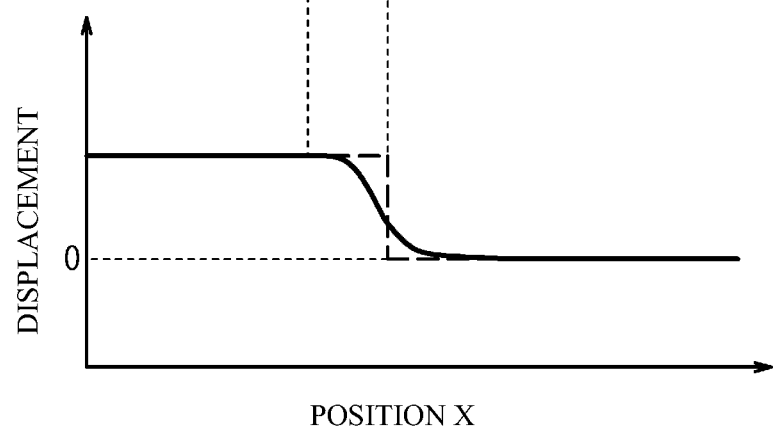
FIG. 10B illustrates a displacement of a piezoelectric membrane.

Next, s description is given of a second comparative example. The second comparative example corresponds to Document 1. FIG. 10A illustrates a schematic cross sectional view around an edge of a resonance region of a resonator in accordance with the second comparative example. FIG. 10B illustrates a displacement of a piezoelectric membrane. As illustrated in FIG. 10A, a thin membrane region 30 is provided at the edge of the resonance region 20. The thickness of the upper electrode 16 is small in the thin membrane region 30. The other structure is the same as that of FIG. 9A. Therefore, the explanation is omitted.

FIG. 11A and FIG. 11B illustrate a dispersion curve in a center portion of a resonance region and a thin membrane region of the second comparative example. As illustrated in FIG. 11A, a resonance frequency fr of the resonance region 20 is approximately a cutoff frequency f0 in the center portion of the resonance region 20. A frequency region 40 is a region at a frequency lower than the cutoff frequency f0 in which a spurious is generated. As illustrated in FIG. 11B, in the thin membrane region 30, the upper electrode 16 is thin. Therefore, the cutoff frequency f0 is shifted toward high frequency side. Thus, the wave number of an acoustic wave at the same frequency as an acoustic wave in the center portion of the resonance region 20 gets larger. Therefore, as illustrated in FIG. 10B, the displacement with respect to an actual position X gets closer to an ideal displacement. Therefore, in the second comparative example, the spurious is restrained, compared to the first comparative example.

Figure 12A:
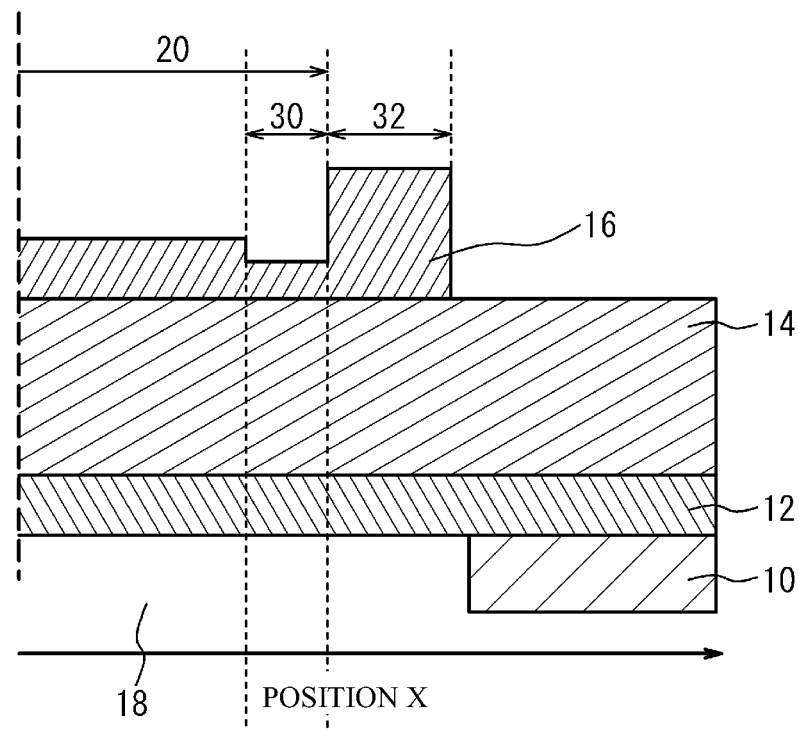
FIG. 12A illustrates a schematic cross sectional view around an edge of a resonance region of a resonator in accordance with a third comparative example.
Figure 12B:
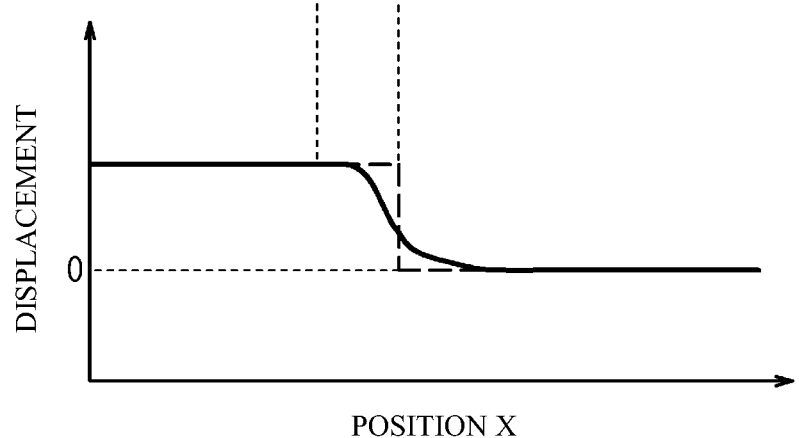
FIG. 12B illustrates a schematic view of a displacement of a piezoelectric membrane.

Next, a description is given of a third comparative example. The third comparative example corresponds to Document 2 and Document 3. FIG. 12A illustrates a schematic cross sectional view around an edge of a resonance region of a resonator in accordance with the third comparative example. FIG. 12B illustrates a schematic view of a displacement of the piezoelectric membrane 14. As illustrated in FIG. 12A, a thick membrane region 32 is provided outside of the thin membrane region 30, being different from FIG. 10A. The thickness of the upper electrode 16 is larger than that of the center portion of the resonance region 20, in the thick membrane region 32. The other structure is the same as FIG. 10A. Therefore, the explanation is omitted.

FIG. 13A through FIG. 13C illustrate dispersion curves of the center portion of the resonance region, the thin membrane region and the thick membrane region of the third comparative example. The dispersion curves of FIG. 13A and FIG. 13B are the same as those of FIG. 11A and FIG. 11B. Therefore, as illustrated in FIG. 12B, the displacement with respect to the position X is approximately the same as that of FIG. 10B. As illustrated in FIG. 13C, in the thick membrane region 32, the upper electrode 16 is thick. Therefore, the cutoff frequency f0 is shifted toward low frequency side. Thus, in the thick membrane region 32, the dispersion coefficient of an acoustic wave at the resonance frequency fr of the resonance region 20 is an imaginary number. Therefore, the propagation is not established. Thus, it is possible to attenuate an acoustic wave propagating in the planar direction of the piezoelectric membrane 14, in the thick membrane region 32. It is therefore possible to restrain the spurious.

However, in the second and third comparative examples, as illustrated in FIG. 11B and FIG. 13B, the cutoff frequency f0 is shifted toward high frequency side relative to the resonance frequency fr of the resonance region 20, in the thin membrane region 30. In this case, the propagation coefficient is an ideal number at a frequency higher than the resonance frequency fr of the resonance region 20. Therefore, an acoustic wave not contributing to a resonance is not attenuated. Thereby, a loss occurs.

Figure 14A:
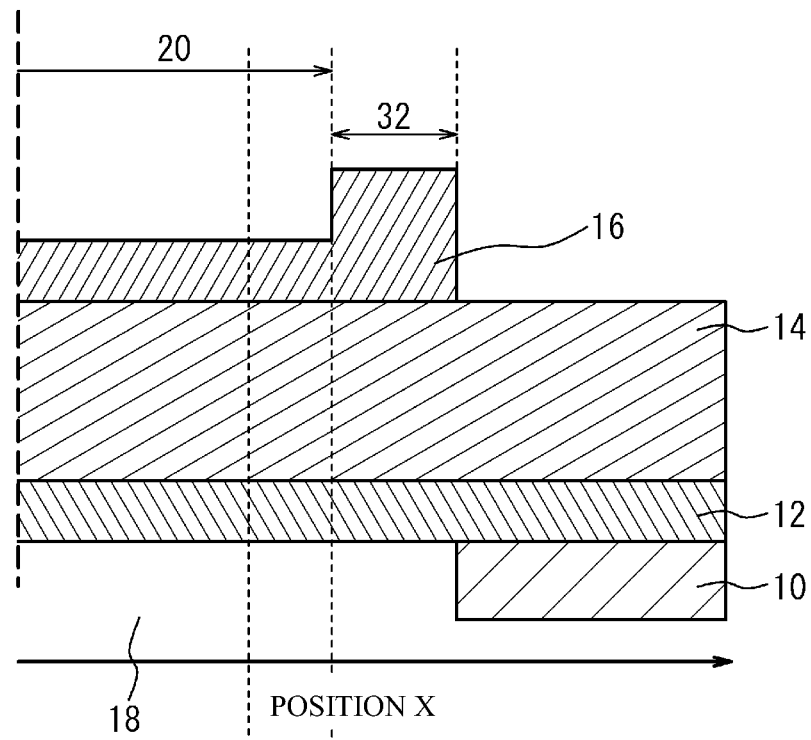
FIG. 14A illustrates a schematic cross sectional view around an edge of a resonance region of a resonator in accordance with a fourth comparative example.
Figure 14B:
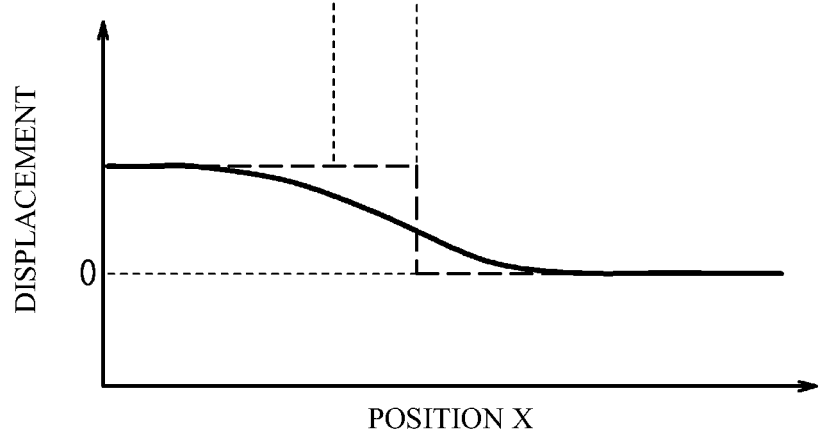
FIG. 14B illustrates a schematic view of a displacement of a piezoelectric membrane.

Next, a description is given of a fourth comparative example. FIG. 14A illustrates a schematic cross sectional view around an edge of a resonance region of a resonator in accordance with the fourth comparative example. FIG. 14B illustrates a schematic view of a displacement of the piezoelectric membrane 14. As illustrated in FIG. 14A, the thick membrane region 32 is provided at the edge of the resonance region 20. The thickness of the upper electrode 16 is larger than that of the center portion of the resonance region 20, in the thick membrane region 32. The other structure is the same as FIG. 9A. Therefore, the explanation is omitted.

FIG. 15A and FIG. 15B illustrate dispersion curves of the center portion of the resonance region and the thick membrane region of the fourth comparative example. The dispersion curves of FIG. 15A and FIG. 15B are the same as those of FIG. 13A and FIG. 13B. As illustrated in FIG. 15B, in the thick membrane region 32, the dispersion coefficient of an acoustic wave at the resonance frequency fr of the resonance region 20 is an imaginary number. Therefore, the propagation is not established. Thus, it is possible to attenuate an acoustic wave propagating in the planar direction of the piezoelectric membrane 14, in the thick membrane region 32. It is therefore possible to reduce the loss. However, in the fourth comparative example, the thin membrane region 30 is not provided.

Therefore, the cutoff frequency f0 is not increased as illustrated in FIG. 11B. In this case, the displacement fluctuates smoothly with respect to the position X as well as the first comparative example. It is therefore not possible to restrain the spurious.

As illustrated in FIG. 2B, in the series resonator S, a spurious has an influence on the pass band, when the spurious is generated in the frequency band lower than the resonance frequency $f_{rs}$. On the other hand, in the parallel resonator P, even if the spurious is generated in the frequency band lower than the resonance frequency $f_{rp}$, the spurious is out of the pass band. In Document 1, it is proposed that the resonator of the second comparative example that is capable of restraining the spurious is used as the series resonator, and the resonator of the fourth comparative example that is capable of restraining the loss is used as the parallel resonator.

However, in the method, the thin membrane region 30 is provided in the upper electrode 16 of the series resonator. The thick membrane region 32 is provided in the upper electrode 16 of the parallel resonator. When the thin membrane region 30 and the thick membrane region 32 are provided in the upper electrode 16, processing of the upper electrode 16 is complicated. And, a manufacturing cost is increased. Similarly, the manufacturing cost is increased with respect to the resonator of the third comparative example in which the thin membrane region 30 and the thick membrane region 32 are provided in the upper electrode 16 of a single resonator. A description will be given of embodiments establishing low loss and low cost and restraining a spurious.

First Embodiment

Figure 16:
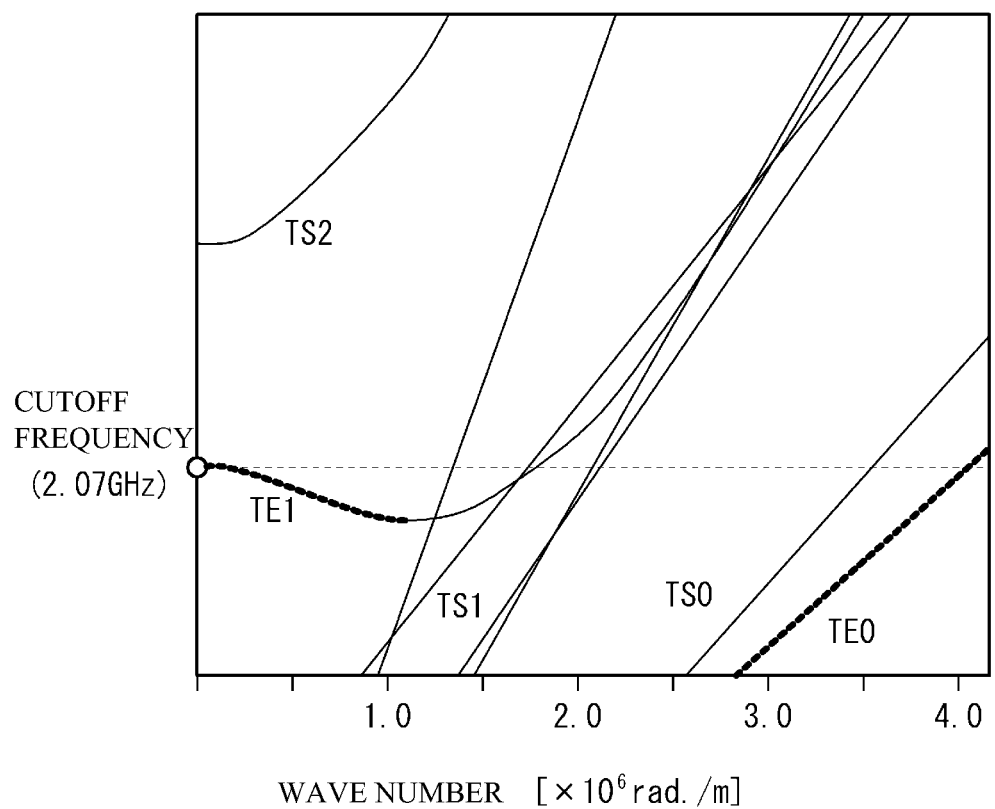
FIG. 16 illustrates a calculation result of a dispersion curve of AlN.

FIG. 16 illustrates a calculation result of a dispersion curve of AlN. A horizontal axis of FIG. 16 indicates a wave number. A vertical axis of FIG. 16 indicates a frequency. The dispersion curve is calculated under a condition that the lower electrode 12 is a molybdenum membrane having a thickness of 350 nm, the upper electrode 16 is a molybdenum membrane having a thickness of 300 nm, and the piezoelectric membrane 14 is an AlN membrane having a thickness of 1050 nm.

In FIG. 16, a mode TE is a thickness longitudinal vibration mode. A mode TS is a thickness lateral vibration mode. A solid line indicated by the mode TE1 is a main mode for a function as a film bulk acoustic resonator. The wave number of the main mode TE1 is an ideal number. A region in which a frequency is reduced together with the wave number is a region (a broken line region of TE1 of FIG. 16) in which a spurious is generated. Here, in FIG. 16, a low order vibration mode TE0 (illustrated with a broken line) of the thickness longitudinal vibration mode that is the same as the main mode TE1 is focused. In FIG. 16, the main mode TE1 is a first order mode. The mode TE0 is a zero order mode. The mode TE0 has no resonance point and does not contribute to a resonance. That is, the mode TE0 is not used for a mechanical vibration and does not contribute as electrical characteristics. It has been found that the spurious is restrained without increasing of loss, if the mode TE0 is used at the edge of the resonance region 20.

Figure 17:
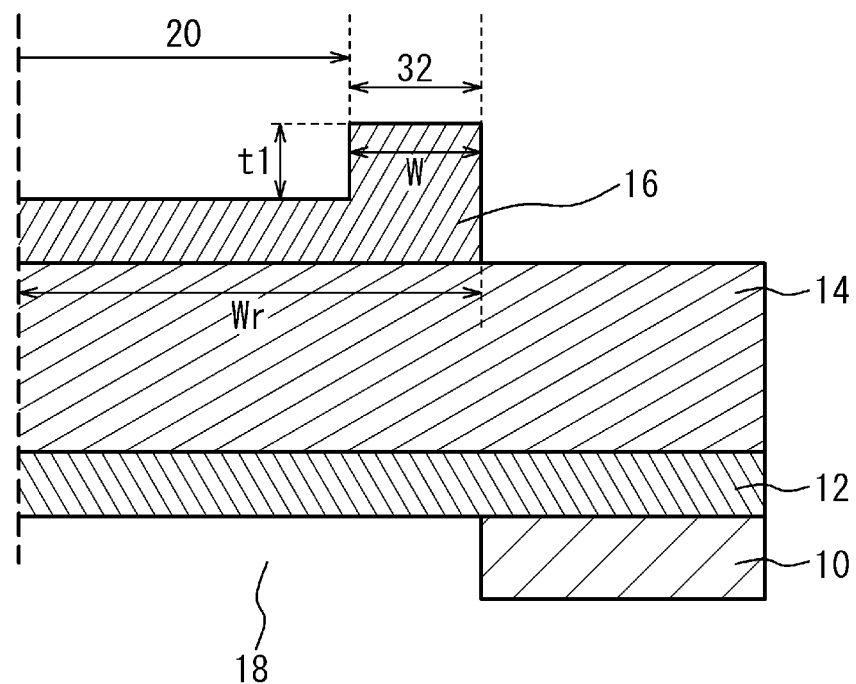
FIG. 17 illustrates a structure used for a simulation in a first embodiment.

FIG. 17 illustrates a structure used for the simulation in the first embodiment. As illustrated in FIG. 17, a simulation was performed with a finite element method with respect to a resonator having the thick membrane region 32 at the edge of the resonance region 20. The structure of FIG. 17 is the same as FIG. 14A. A center of the resonance region 20 (a left side dotted line) is a mirror surfaced interface. In the simulation, a width of the resonance region 20 Wr (half of a width of whole resonance region 20) was 40 μm, a height "t" of the upper electrode 16 of the thick membrane region 32 with respect to the center portion of the resonance region 20 and a width W of the thick membrane region 32 were a parameter. A resonator of which height "t" was 0 was a reference resonator. A Q value of the resonance point, another Q value of an anti-resonance point, an effective electromechanical coupling coefficient $Keff^2$ and an increment of spurious were calculated.

A plurality of the spurious is a first order spurious, a second order spurious, a third order spurious, . . . n-th order spurious in order of getting away from the resonance point. A total of attenuation amount of the first order spurious to the third order spurious was calculated as an increment of the spurious. The increment of the spurious is obtained by subtracting a total of attenuation amounts of the reference resonator from the total of the attenuation amount. When the increment of the spurious is minus, the spurious is restrained, compared to the reference resonator.

Figure 18A:
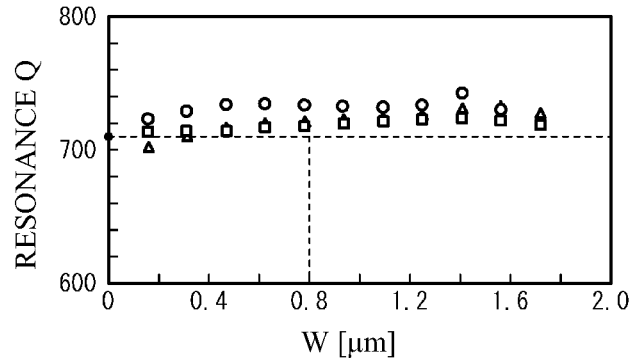
FIG. 18A through FIG. 18D illustrate a simulation result of the first embodiment.
Figure 18B:
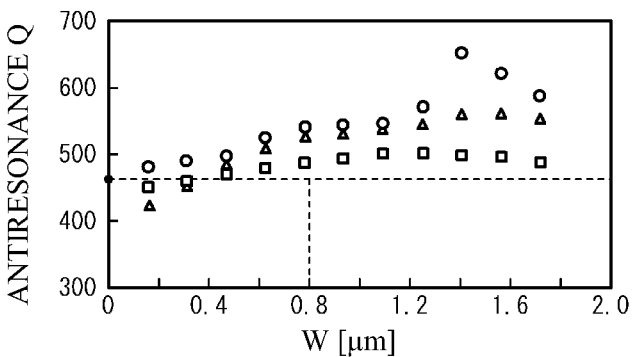
Figure 18C:
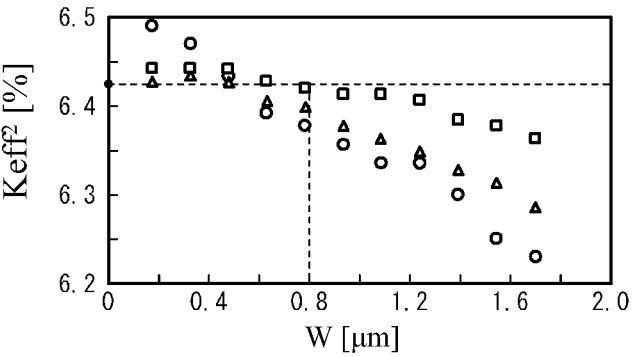
Figure 18D:
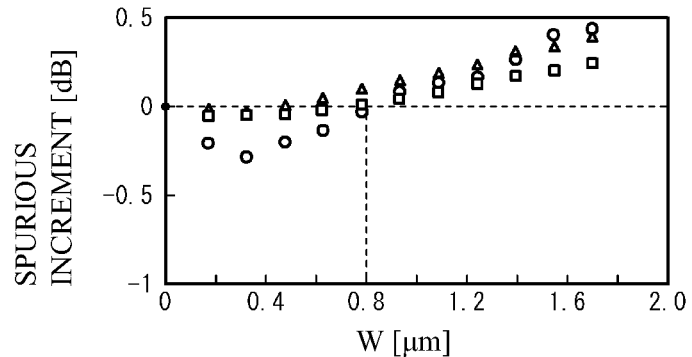

FIG. 18A through FIG. 18D illustrate a simulation result of the first embodiment. FIG. 18A illustrates a Q value of the resonance point with respect to the width W of the thick membrane region 32. FIG. 18B illustrates a Q value of the anti-resonance point with respect to the width W. FIG. 18C illustrates an effective electromechanical coupling coefficient $Keff^2$ with respect to the width W. FIG. 18D illustrates the spurious increment with respect to the width W. A black circle of which width W is zero indicates a value of a reference resonator. White squares are a calculation result in a case where the height "t" is 25 nm. White triangles are a calculation result in a case where the height "t" is 100 nm. White circles are a calculation result in a case where the height "t" is 200 nm.

As illustrated in FIG. 18D, in many cases, the spurious increment is minus with respect to any height "t" when the width W of the thick membrane region 32 is 0.8 μm or less. That is, the spurious is restrained, compared to the reference resonator. As illustrated in FIG. 18A through FIG. 18C, the Q value of the resonance point, the Q value of the anti-resonance point, and the effective electromechanical coupling coefficient $Keff^2$ tend to slightly increase in the range where the width W of the thick membrane region 32 is 0.8 μm or less. Therefore, the resonance characteristics are not subjected to adverse effect even if the width W of the thick membrane region 32 is 0.8 μm or less.

Table 1 shows wavelengths of the mode TE0 at frequencies where the first order spurious to the third order spurious are generated and the height "t" is 200 nm. Table 1 shows that the wavelengths of the mode TE0 are 1.69 μm to 1.7 μm in spite of the order of the spurious. Therefore, the width W of the thick membrane region 32 restraining the spurious is half or less of the wavelength of the mode TE0.

TABLE 1

| ORDER OF SPURIOUS | FREQUENCY | TE0 WAVELENGTH |
| --- | --- | --- |
| 1 | 2.06808 GHz | 1.68999 μm |
| 2 | 2.06064 GHz | 1.69609 μm |
| 3 | 2.05592 GHz | 1.69999 μm |

The mode TE0 is a thickness longitudinal vibration mode that is similar to the mode TE1 acting as a main mode. Therefore, the mode TE0 is interfered with the mode TE1 easily. It is thought that the spurious of the mode TE1 is restrained by making interference between the width W of the thick membrane region 32 and the mode TE0 at the edge of the resonance region 20. Further, it is thought that the resonance characteristics are not subjected adverse influence because of the mode TE0, because the mode TE0 does not contribute to the resonance.

In accordance with the consideration, it is preferable that the width W of the thick membrane region 32 is the wavelength of the mode TE0 or less. It is more preferable that the width W of the thick membrane region 32 is half of the wavelength of the mode TE0 or less. It is still more preferable that the width W of the thick membrane region 32 is one-third of the wavelength of the mode TE0 or less.

A dispersion formula of the mode TE0 is expressed by the following formula 1 if the piezoelectric membrane 14 is a film bulk acoustic resonator of a single layer type. In the formula 1, "f" indicates an exited frequency, "k" indicates a wave number, "c11" indicates a stiffness of the piezoelectric membrane 14, and "ρ" indicates a density of the piezoelectric membrane 14.

$$f = \sqrt{\frac{c11}{\rho}} k \qquad \text{Formula 1}$$

In an actual film bulk acoustic resonator, the lower electrode 12 and the upper electrode 16 and so on are added to the piezoelectric membrane 14. In this case, the formula 1 is converted into the following formula 2.

$$f < \sqrt{\frac{c11}{\rho}} k \qquad \text{Formula 2}$$

The resonance frequency is expressed as "fr". In this case, the wavelength λ of the mode TE0 satisfies the following formula 3.

$$\lambda < \frac{1}{f_r} \sqrt{\frac{c11}{\rho}} \qquad \text{Formula 3}$$

For example, the formula 3 is converted into λ<5 μm, when the resonance frequency of the resonator "fr" is 2.07 GHz, the stiffness of AlN "c11" is 3.45×10$^{11}$ N/m$^2$, and the density of AlN "ρ" is 3260 kg/m$^3$. This corresponds to the calculation result that the wavelength "λ" of the mode TE0 is 1.69 to 1.7 μm. It is thought that the difference between 5 μm and 1.69 to 1.7 μm means the mass addition of the lower electrode 12 and the upper electrode 16. In the calculation of FIG. 18, the density and the thickness of the lower electrode 12 and the upper electrode 16 are enlarged in order to enlarge the effective electromechanical coupling coefficient Keff$^2$. Therefore, the sound speed is reduced. And a divergence between the mode TE0 and the formula 3 is enlarged.

As mentioned above, it is preferable that the width W of the thick membrane region 32 satisfies the following formula 4 in order to make interference between the width W of the thick membrane region 32 and the mode TE0.

$$w < \frac{1}{f_r} \sqrt{\frac{c11}{\rho}} \qquad \text{Formula 4}$$

Figure 19:
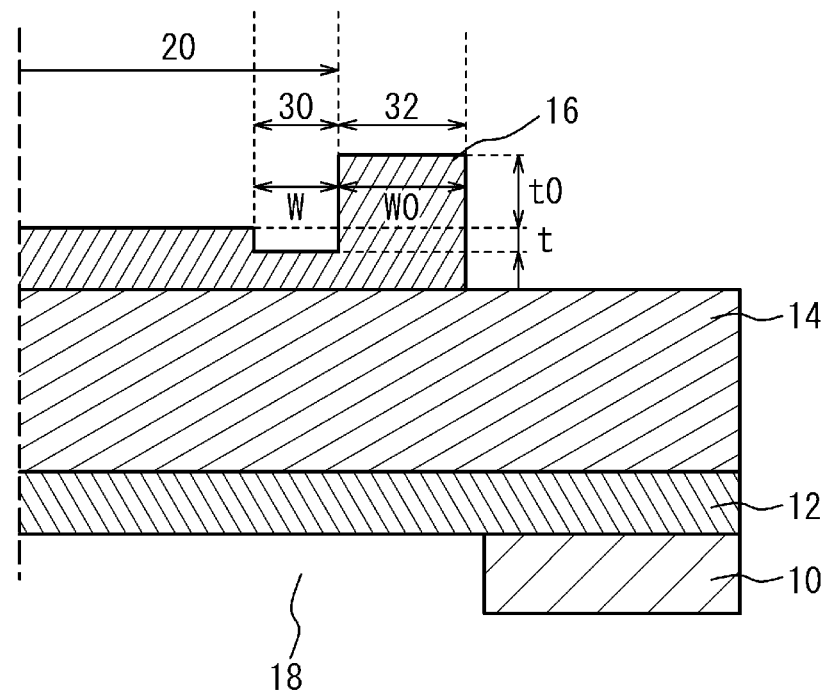
FIG. 19 illustrates a configuration diagram used for a simulation in the third comparative example.

Next, a comparison was made between the first embodiment and the third comparative example. FIG. 19 illustrates a configuration diagram used for the simulation in the third comparative example. As illustrated in FIG. 19, a simulation was performed with a finite element method with respect to a resonator having the thin membrane region 30 and the thick membrane region 32 at the edge of the resonance region 20. The structure of FIG. 19 is the same as FIG. 12A. A center of the resonance region 20 is a mirror surfaced interface. In the simulation, the height "t" of the upper electrode 16 of the thin membrane region 30 with respect to the center portion of the resonance region 20, the width W0 of the thick membrane region 32 and the width W of the thin membrane region 30 were a parameter. The width W0 was fixed to 2 μm. The height "t0" was fixed to 100 nm. The height "t" was fixed to 25 nm. The structure used for the simulation of the first embodiment is the same as FIG. 17. The height "t" of the first embodiment was 200 nm.

Figure 20A:
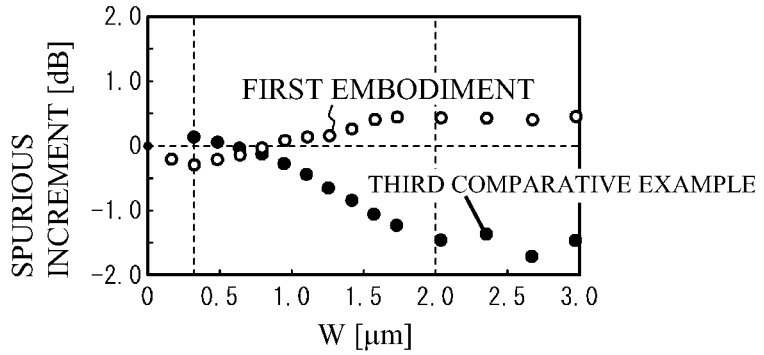
FIG. 20A through FIG. 20D illustrate simulation results of a first embodiment and the third comparative example.
Figure 20B:
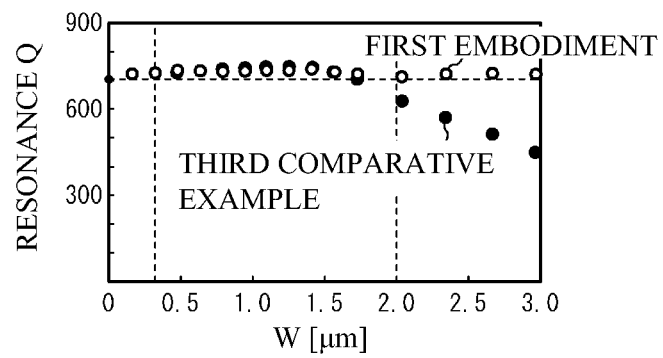
Figure 20C:
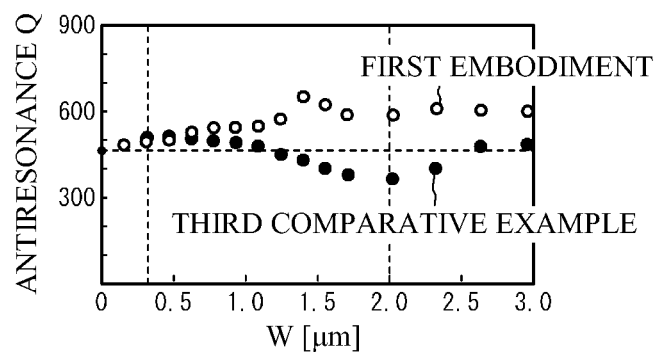
Figure 20D:
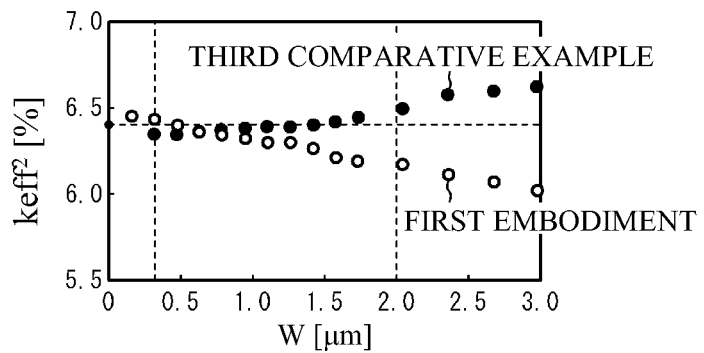

FIG. 20A through FIG. 20D illustrate simulation results of the first embodiment and the third comparative example. FIG. 20A illustrates the spurious increment with respect to the width W. FIG. 20B illustrates a Q value of the resonance point with respect to the width W. FIG. 20C illustrates a Q value of the anti-resonance point with respect to the width W. FIG. 20D illustrates an effective electromechanical coupling coefficient Keff$^2$ with respect to the width W. Black circles indicate the third comparative example. White circles indicate the first embodiment. The black circle of which width W is zero indicates a value of a reference resonator.

As illustrated in FIG. 20A, in the third comparative example, the restraint of the spurious is maximum around the width W=2 μm. On the other hand, in the first embodiment, the restraint of the spurious is maximum around the width W=0.4 μm. When a comparison is made between the Q value at the resonance point and the Q value at the anti-resonance point at the width W where the restraint of the spurious is maximum in FIG. 20B and FIG. 20C, the Q value is smaller than that of the reference resonator at the width W=2 μm in the third comparative example. On the other hand, in the first embodiment, the Q value is approximately the same as that of the reference resonator at the width W=0.4 μm.

Figure 21:
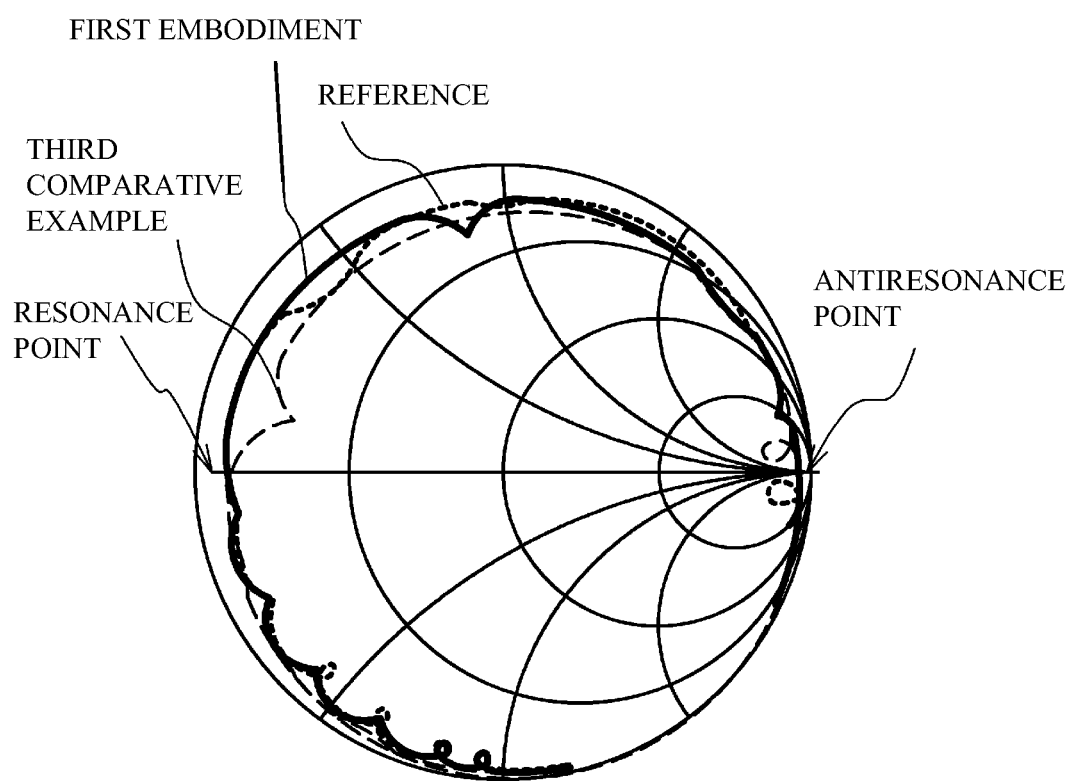
FIG. 21 illustrates a Smith chart of pass characteristics of a reference resonator and resonators of the first embodiment and the third comparative example.

FIG. 21 illustrates a Smith chart of pass characteristics of the reference resonator and the resonators of the first embodiment and the third comparative example. A solid line indicates the width W=0.4 μm of the first embodiment. A broken line indicates the width W=2 μm of the third comparative example. A dotted line indicates the simulation result of the reference resonator. In the third comparative example, the pass characteristics pass inside of the reference at a frequency higher than the resonance point. This indicates that the loss is greater in the third comparative example. On the other hand, in the first embodiment, the pass characteristics are the same as those of the reference resonator. Therefore, the loss of the first embodiment is approximately the same as that of the reference resonator. On the other hand, the spurious of the first embodiment is smaller than that of the reference resonator at a frequency lower than the resonance point. It is therefore possible to restrain the spurious in addition to restraining the loss in the first embodiment.

In accordance with the first embodiment, the width W of the thick membrane region 32 is smaller than a wavelength of an acoustic wave propagating in a direction crossing a thickness direction of the piezoelectric membrane 14. It is therefore possible to make interference between the thick membrane region 32 and the acoustic wave propagating in the thickness direction of the piezoelectric membrane 14 and restrain the spurious.

Here, the acoustic wave propagating in the direction crossing the thickness direction of the piezoelectric membrane 14 is a low order acoustic wave having the same vibration mode as a main mode of an acoustic wave where a film bulk acoustic resonator oscillates. That is, the width W of the thick membrane region 32 is smaller than the wavelength of the mode TE0. This restrains the degradation of the resonance characteristics. And the spurious is restrained.

The width W of the thick membrane region 32 satisfies the formula 4. It is therefore possible to restrain the spurious by making interference between the thick membrane region 32 and an acoustic wave.

In accordance with the first embodiment, it is only necessary to set the width W of the thick membrane region 32 of the upper electrode 16 with respect to the resonance region 20. It is not necessary to provide the thick membrane region 32 or the thin membrane region 30 in the upper electrode 16 as the third comparative example. Therefore, the processing of the upper electrode 16 gets easier, and the manufacturing cost may be restrained.

In the first embodiment, the thick membrane region 32 is a part of the upper electrode 16 having a thickness larger than that of the center portion of the resonance region 20. However, the thick membrane region 32 may be a part of at least one of the lower electrode 12 and the upper electrode 16 having a thickness larger than that of the center portion of the resonance region 20. However, when the lower electrode 12 has an uneven surface, the uneven surface may become an origination of cracking of the piezoelectric membrane 14 during forming the piezoelectric membrane 14 having high orientation. It is therefore preferable that the thickness of the lower electrode 12 in the resonance region 20 is constant and the thickness of an edge of the resonance region 20 of the upper electrode 16 is larger than that of the center portion.

The lower electrode 12 and the upper electrode 16 may be a metal membrane such as Cr (chromium), Ru (ruthenium), Al (aluminum), Cu (copper), W (tungsten), Ta (tantalum), Pt (platinum), Rh (rhodium) or Ir (iridium) in addition to molybdenum, or a composite membrane of them. The substrate 10 may be a Si substrate, a silica substrate, a glass substrate, a ceramics substrate, a GaAs substrate or the like. The piezoelectric membrane 14 may be ZnO (zinc oxide), PZT (zirconate titanate), $PbTiO_3$ (lead titanate) or the like in addition to AlN. However, it is preferable that the Poisson ratio is 0.3 or less so that the propagation coefficient becomes an ideal number at a frequency lower than the cutoff frequency.

Second Embodiment

In FIG. 19 and FIG. 20A, the loss of the first embodiment is smaller than that of the third comparative example. However, the restraint degree of the spurious of the first embodiment is not larger than that of the third comparative example. It is thought this is because there does not exist a region, in which a wave number is an imaginary number, at the edge of the resonance region 20 restraining the spurious. The mode TE0 is a mode without the cutoff frequency. Therefore, it is difficult to form a region, in which a wave number is an imaginary number, outside of the resonance region by forming a thin membrane region or a thick membrane region in the upper electrode 16.

Figure 22A:
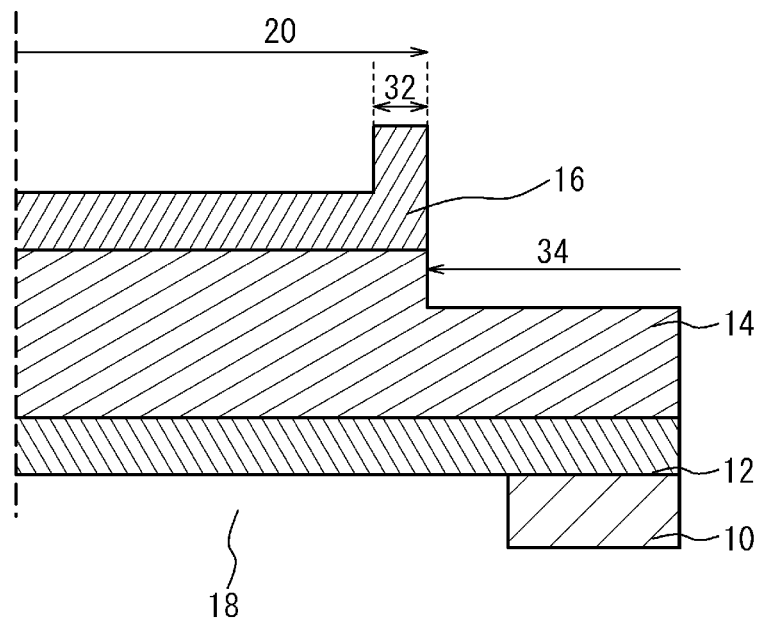
FIG. 22A and FIG. 22B illustrate a cross sectional view of a film bulk acoustic resonator in accordance with a second embodiment.
Figure 22B:
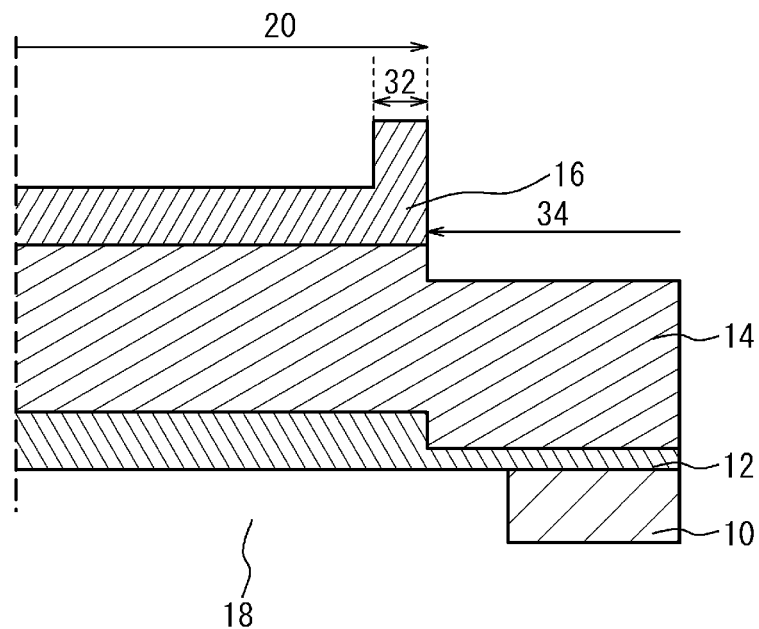

FIG. 22A and FIG. 22B illustrate a cross sectional view of a film bulk acoustic resonator in accordance with the second embodiment. As illustrated in FIG. 22A, the thickness of the piezoelectric membrane 14 is smaller than that of the resonance region 20 in a region 34 outside of the thick membrane region 32. And, as illustrated in FIG. 22B, the thickness of the lower electrode 12 is smaller than that of the resonance region 20 in the region 34 outside of the thick membrane region 32.

Thus, it is possible to enlarge a difference of wave number between the thick membrane region 32 and the region 34. It is therefore possible to enlarge a mismatch of sound impedance between the thick membrane region 32 and the region 34 and to restrain the spurious more.

In accordance with the second embodiment, as illustrated in FIG. 22A, a part of the piezoelectric membrane 14 outside of the resonance region 20 may be thinner than another part of the piezoelectric membrane 14 in the resonance region 20. It is therefore possible to restrain the spurious.

With respect to the thick membrane region 32, when one of the lower electrode 12 and the upper electrode 16 is thicker than the center portion of the resonance region 20 as illustrated in FIG. 22B, it is preferable that the other is thinner than the resonance region 20. This allows restraining of the spurious.

Third Embodiment

Figure 23:
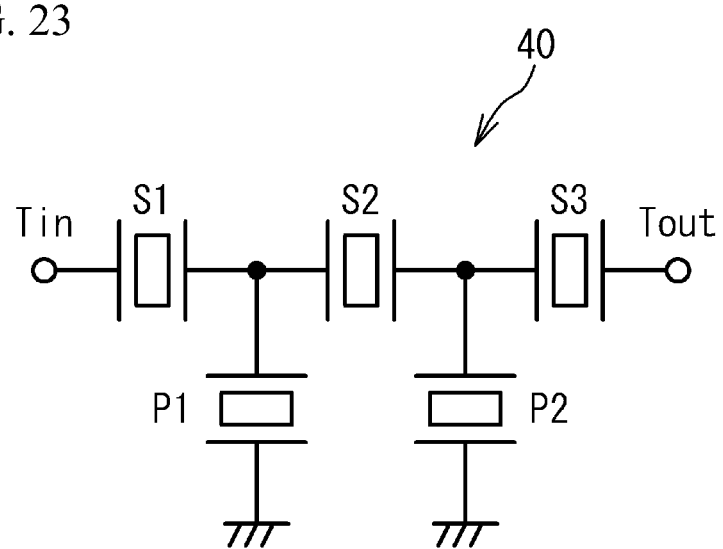
FIG. 23 illustrates a circuit diagram of a ladder type filter in accordance with a third embodiment.

A third embodiment is an example of using the film bulk acoustic resonators in accordance with the first embodiment and the second embodiment as a ladder type filter. FIG. 23 illustrates a circuit diagram of a ladder type filter in accordance with the third embodiment. As illustrated in FIG. 23, the ladder type filter has one or a plurality of series resonators S1 to S3 and one or a plurality of parallel resonators P1 and P2. The one or the plurality of the series resonators S1 to S3 are coupled in series between the inputting terminal Tin and the outputting terminal Tout. The one or the plurality of the parallel resonators P1 and P2 are coupled in parallel between the inputting terminal Tin and the outputting terminal Tout.

When a spurious is generated at a frequency lower than the resonance frequency as illustrated in FIG. 5B and is generated in the series resonator S as illustrated in FIG. 2B, a ripple may be generated in a pass band. On the other hand, even if a spurious is generated in the parallel resonator P, no ripple is generated in the pass band.

And so, the film bulk acoustic resonators in accordance with the first embodiment or the second embodiment are used as the series resonators S1 to S3. This allows restraining of the spurious in the pass band.

In the series resonators S1 to S3, the width W of the thick membrane region 32 of the first embodiment is reduced, and thereby the spurious is restrained as illustrated in FIG. 18D. On the other hand, in the parallel resonators P1 and P2, the width W of the thick membrane region 32 is enlarged, and thereby the Q value is enlarged as illustrated in FIG. 18A and FIG. 18B. Thus, the width of the thick membrane region 32 of the parallel resonators P1 and P2 is larger than that of the thick membrane region 32 of the series resonators S1 to S3. Thus, the ripple in the pass band is restrained, and a ladder type filter having small loss in the pass band is provided. Further, it is not necessary to provide the thin membrane region 30. Therefore, the manufacturing cost is restrained.

Fourth Embodiment

Figure 24:
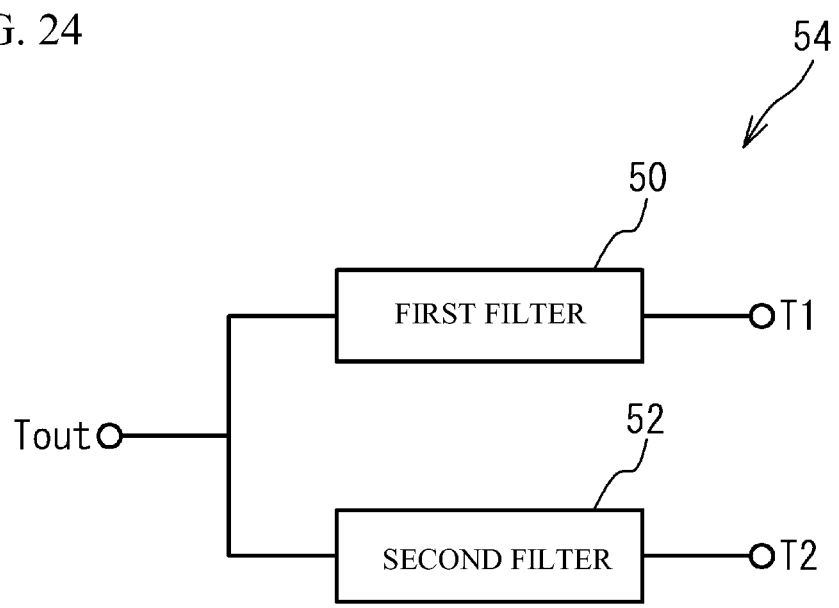
FIG. 24 illustrates a circuit diagram of a duplexer in accordance with a fourth embodiment.

A fourth embodiment is an example of using the ladder type filter in accordance with the third embodiment as a duplexer. FIG. 24 illustrates a circuit diagram of a duplexer in accordance with the fourth embodiment. As illustrated in FIG. 24, a duplexer 54 in accordance with the fourth embodiment has a first filter 50 and a second filter 52. The first filter 50 is coupled between a common terminal Tant and a first terminal T1. The second filter 52 is coupled between the common terminal Tant and a second terminal T2. A pass band of the second filter 52 is higher than that of the first filter 50.

Generally, the first filter 50 having a lower pass band may be a transmitting filter, and the second filter 52 having a higher pass band may be a receiving filter.

When the first filter 50 is a transmitting filter and the second filter 52 is a receiving filter, the first filter 50 filters a transmitted signal input to the first terminal T1 and outputs the filtered signal to the common terminal Tant. The first filter 50 restrains outputting of a received signal to the first terminal T1 by suppressing the received signal. The second filter 52 filters a received signal input to the common terminal Tant and outputs the filtered signal to the second terminal T2. The second filter 52 restrains outputting of a transmitted signal to the second terminal T2 by suppressing the transmitted signal.

When the Q value of the series resonator is low, precipitousness at higher frequency of the pass band is degraded. In this case, when a resonator having a tradeoff relation between the restraint of the spurious and the Q value is used as a series resonator as the third comparative example, the precipitousness at higher frequency of the pass band may be sacrificed. The resonators of the first embodiment and the second embodiment can establish the restraint of the spurious and the Q value as illustrated in FIG. 20A through FIG. 20C. It is therefore preferable that the resonators are used as a filter on which the precipitousness at higher frequency of the pass band is demanded. It is preferable that at least the first filter 50 is used as the ladder type filter in accordance with the third embodiment.

Fifth Embodiment

Figure 25:
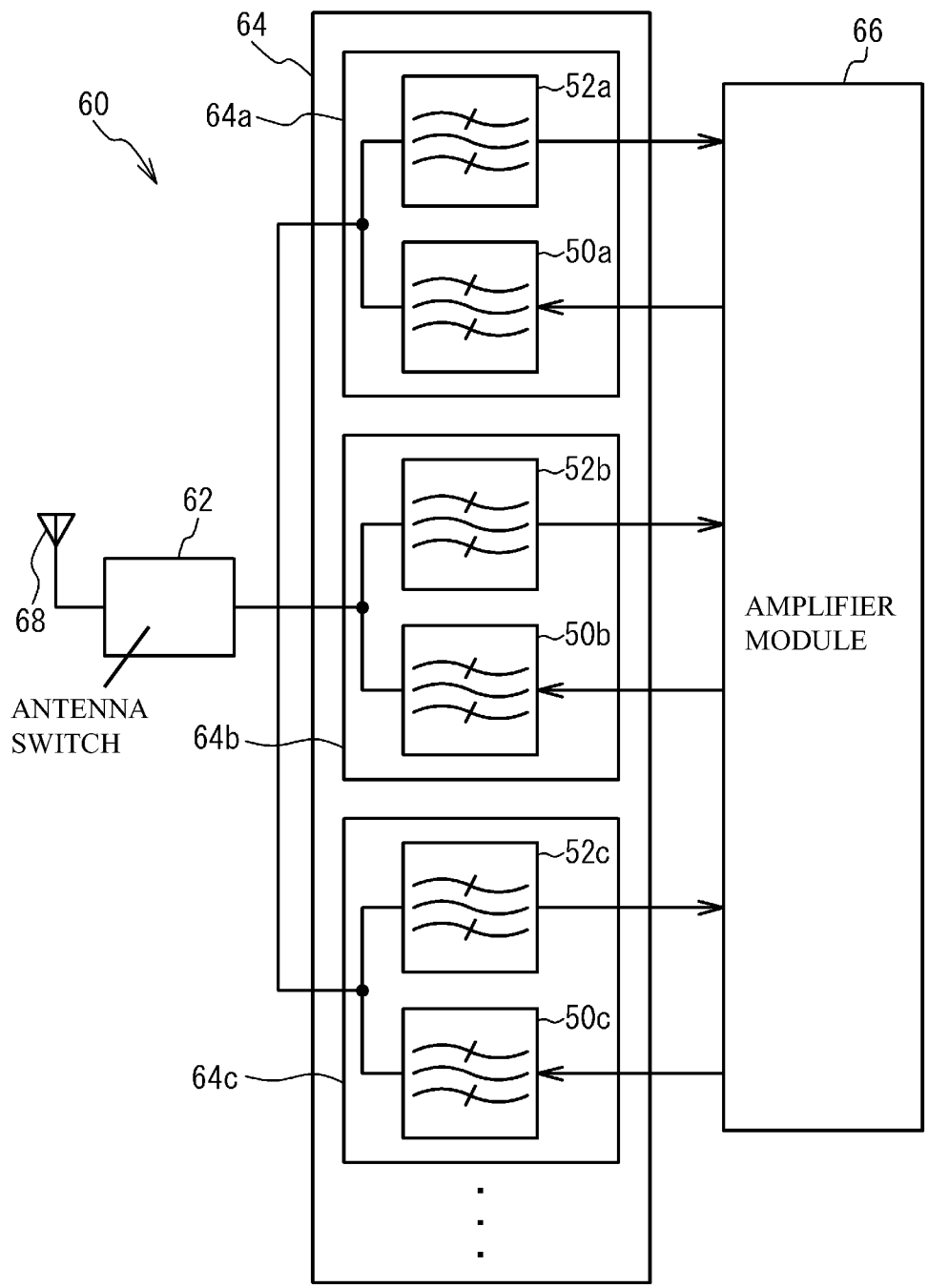
FIG. 25 illustrates a block diagram of a communication module in accordance with a fifth embodiment.

A fifth embodiment is an example of a communication module having the duplexer in accordance with the fourth embodiment. FIG. 25 illustrates a block diagram of a communication module in accordance with the fifth embodiment. As illustrated in FIG. 25, a communication module 60 has an antenna 68, an antenna switch 62, a duplexer bank 64, and an amplifier module 46. The communication module 60 is an RF module for a mobile phone and covers a plurality of communication systems such as a GSM (Global System Mobile Communication) communication system or a W-CDMA communication system. The GSM system covers 850 MHz band (GAM850), 900 MHz band (GSM900), 1800 MHz band (GSM1800), and 1900 MHz band (GAM1900). The antenna 104 may transmit or receive a signal of the GSM system or the W-CDMA system.

The duplexer bank 64 includes a plurality of duplexers 64a to 64c. The duplexers 64a to 64c includes transmitting filters 50a to 50c and receiving filters 52a to 52c respectively. The duplexers 64a to 64c are a duplexer covering different communication system. The antenna switch 62 selects a duplexer covering a communication system from the plurality of duplexers included in the duplexer bank 64 according to a communication system of a transmitted or received signal. And, the antenna switch 62 couples the selected duplexer and the antenna 68. Each of the duplexers is coupled to an amplifier module 66. The amplifier module 66 amplifies a signal received by the transmitting filters 50a to 50c of the duplexers 64a to 64c, and outputs the amplified signal to a processing unit. And, the amplifier module 66 amplifies a signal generated by the processing unit and outputs the amplified signal to the receiving filters 52a to 52c of the duplexer.

At least one of the duplexers 64a to 64c is the duplexer 54 in accordance with the fourth embodiment. Thus, it is possible to provide a communication module that restrains a ripple of a pass band and has a small loss. The communication module may be mounted on an electronic device such as a wireless LAN (Local Area Network), a personal computer, or a PDA (Personal Digital Assistant: mobile information terminal).

Sixth Embodiment

Figure 26:
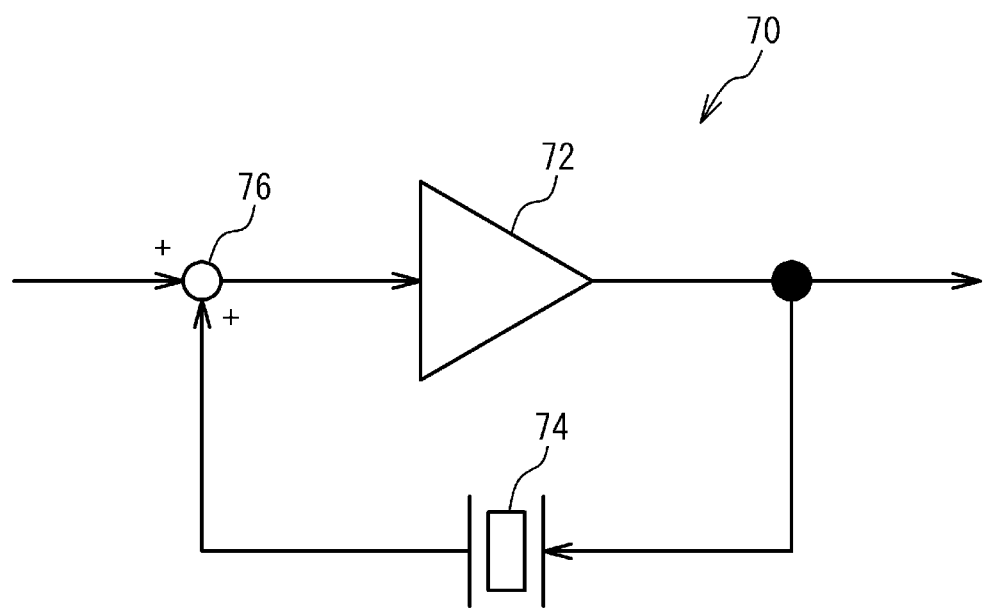
FIG. 26 illustrates a block diagram of an oscillation module in accordance with a sixth embodiment.

A sixth embodiment is an example of an oscillation module including the film bulk acoustic resonator in accordance with the first embodiment or the second embodiment. FIG. 26 illustrates a block diagram of an oscillation module in accordance with the sixth embodiment. As illustrated in FIG. 26, an oscillation module 70 includes an amplifier 72, a film bulk acoustic resonator 74 and an accumulator 76. An output of the amplifier 72 returns to an input of the amplifier 72 via the film bulk acoustic resonator 74. The accumulator 76 positively returns an output of the amplifier 72 to an input of the amplifier 72. Thus, the oscillation module 70 acts as an oscillator.

The film bulk acoustic resonator of the first embodiment or the second embodiment may be used as a module such as a communication module or an oscillation module, as the fifth embodiment and the sixth embodiment.

The present invention is not limited to the specifically described embodiments, but other embodiments and variations may be made without departing from the scope of the claimed invention.

What is claimed is:

1. A filter comprising:
   one or a plurality of parallel resonators coupled between an inputting terminal and an outputting terminal in parallel; and
   one or a plurality of film bulk acoustic resonators that act as a series resonator and are coupled between the inputting terminal and the outputting terminal in series,
   at least one of the one or plurality of film bulk acoustic resonators having a substrate, a lower electrode provided on the substrate, a piezoelectric membrane provided on the lower electrode, and an upper electrode provided on the piezoelectric membrane,
   wherein:
   at least one of the lower electrode and the upper electrode has a thick membrane region having a thickness larger than a thickness of a center portion of a resonance region at an edge of the resonance region, the resonance region being a region where the lower electrode and the upper electrode face with each other through the piezoelectric membrane;
   a width of the thick membrane region is smaller than a wavelength of an acoustic wave propagating in a direction crossing a thickness direction of the piezoelectric membrane; and
   the acoustic wave propagating in the direction crossing the thickness direction of the piezoelectric membrane is a low order acoustic wave having a same vibration mode as a main mode of an acoustic wave with which the at least one of the one or plurality of film bulk acoustic resonators oscillates.

2. The filter as claimed in claim 1, wherein:
   one of the lower electrode and the upper electrode is thicker than the center portion of the resonance region in the thick membrane region; and
   the other is thinner than the resonance region.

3. The filter as claimed in claim 1, wherein a Poisson ratio of the piezoelectric membrane is 0.3 or less.

4. The filter as claimed in claim 1, wherein the width of the thick membrane region is half or less of the wavelength of the acoustic wave propagating in the direction crossing the thickness direction of the thick membrane.

5. The filter as claimed in claim 1, wherein a void or an acoustic multi layer membrane is provided under the lower electrode of the resonance region.

6. A duplexer comprising:
the filter according to claim 1, as a first filter, coupled between a common terminal and a first terminal; and
a second filter that is coupled between the common terminal and a second terminal and has a pass band higher than that of the first filter.

7. The filter as claimed in claim 1, wherein a part of the piezoelectric membrane outside of the resonance region is thinner than another part of the piezoelectric membrane in the resonance region.

8. A filter comprising:
one or a plurality of parallel resonators coupled between an inputting terminal and an outputting terminal in parallel; and
one or a plurality of film bulk acoustic resonators that act as a series resonator and are coupled between the inputting terminal and the outputting terminal in series,
at least one of the one or plurality of film bulk acoustic resonators having a substrate, a lower electrode provided on the substrate, a piezoelectric membrane provided on the lower electrode, and an upper electrode provided on the piezoelectric membrane,
wherein:
at least one of the lower electrode and the upper electrode has a thick membrane region having a thickness larger than a thickness of a center portion of a resonance region at an edge of the resonance region, the resonance region being a region where the lower electrode and the upper electrode face with each other through the piezoelectric membrane; and
a width "w" of the thick membrane region is expressed as the following formula when a resonance frequency of the at least one of the one or plurality of film bulk acoustic resonators is "fr", stiffness of the piezoelectric membrane is "c11", and a density of the piezoelectric membrane is "ρ"

$$w < \frac{1}{f_r}\sqrt{\frac{c11}{\rho}}.$$

9. The filter as claimed in claim 8, wherein a void or an acoustic multi layer membrane is provided under the lower electrode of the resonance region.

10. The filter as claimed in claim 8, wherein:
one of the lower electrode and the upper electrode is thicker than the center portion of the resonance region in the thick membrane region; and
the other is thinner than the resonance region.

11. The filter as claimed in claim 8, wherein a part of the piezoelectric membrane outside of the resonance region is thinner than another part of the piezoelectric membrane in the resonance region.

12. The filter as claimed in claim 8, wherein a Poisson ratio of the piezoelectric membrane is 0.3 or less.

13. The filter as claimed in claim 8, wherein:
the one or plurality of parallel resonators comprising: a substrate, a lower electrode provided on the substrate; a piezoelectric membrane provided on the lower electrode; and an upper electrode provided on the piezoelectric membrane, wherein at least one of the lower electrode and the upper electrode has a thick membrane region having a thickness larger than a thickness of a center portion of a resonance region at an edge of the resonance region, the resonance region being a region where the lower electrode and the upper electrode face with each other through the piezoelectric membrane; and
a width of the thick membrane region of the one or plurality of the parallel resonators is larger than a width of the thick membrane region of the at least one of the one or plurality of the film bulk acoustic resonators.

14. A filter comprising:
one or a plurality of parallel resonators coupled between an inputting terminal and an outputting terminal in parallel; and
one or a plurality of film bulk acoustic resonators that act as a series resonator and are coupled between the inputting terminal and the outputting terminal in series,
at least one of the one or plurality of film bulk acoustic resonators having a substrate, a lower electrode provided on the substrate, a piezoelectric membrane provided on the lower electrode, and an upper electrode provided on the piezoelectric membrane,
wherein:
at least one of the lower electrode and the upper electrode has a thick membrane region having a thickness larger than a thickness of a center portion of a resonance region at an edge of the resonance region, the resonance region being a region where the lower electrode and the upper electrode face with each other through the piezoelectric membrane;
a width of the thick membrane region is smaller than a wavelength of an acoustic wave propagating in a direction crossing a thickness direction of the piezoelectric membrane; and
the one or plurality of parallel resonators comprising: a substrate, a lower electrode provided on the substrate; a piezoelectric membrane provided on the lower electrode; and an upper electrode provided on the piezoelectric membrane, wherein at least one of the lower electrode and the upper electrode has a thick membrane region having a thickness larger than a thickness of a center portion of a resonance region at an edge of the resonance region, the resonance region being a region where the lower electrode and the upper electrode face with each other through the piezoelectric membrane; and
a width of the thick membrane region of the one or plurality of the parallel resonators is larger than a width of the thick membrane region of the at least one of the one or plurality of the film bulk acoustic resonators.

* * * * *